(12) United States Patent
Onoue

(10) Patent No.: US 7,078,801 B2
(45) Date of Patent: Jul. 18, 2006

(54) THERMOELECTRIC MODULE PACKAGE

(75) Inventor: Katsuhiko Onoue, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 10/406,237

(22) Filed: Apr. 4, 2003

(65) Prior Publication Data
US 2003/0214031 A1    Nov. 20, 2003

(30) Foreign Application Priority Data

Apr. 25, 2002 (JP) .............................. 2002-123578
Mar. 19, 2003 (JP) .............................. 2003-075544

(51) Int. Cl.
*H01L 23/34* (2006.01)

(52) U.S. Cl. ...................... 257/712; 257/713
(58) Field of Classification Search ................ 257/467, 257/530, 712–713, 633, 930
See application file for complete search history.

(56) References Cited

U.S. PATENT DOCUMENTS 5,950,067 A * 9/1999 Maegawa et al. .............. 438/22
6,410,971 B1 * 6/2002 Otey ........................... 257/467

FOREIGN PATENT DOCUMENTS

| JP | 63-177541 | 7/1988 |
|---|---|---|
| JP | 3-64048 | 3/1991 |
| JP | 4-303955 | 10/1992 |
| JP | 05-67844 | 3/1993 |
| JP | 05-067844 | 3/1993 |
| JP | 05-226779 | 9/1993 |
| JP | 10-313150 | 11/1998 |
| JP | 11-017041 | 1/1999 |
| JP | 2001-230354 | 8/2001 |
| JP | 2001-339116 | 12/2001 |
| WO | WO 99/50910 | 10/1999 |

OTHER PUBLICATIONS

Copy of Japanese Office Action dated Jan. 17, 2006 (and English translation of relevant portion).

* cited by examiner

*Primary Examiner*—Roy Potter
(74) *Attorney, Agent, or Firm*—Dickstein, Shapiro, Morin & Oshinsky, LLP.

(57) ABSTRACT

A thermoelectric module package stores a thermoelectric module for controlling temperature of a semiconductor element (e.g., a semiconductor laser) having high output power, wherein it is constituted by a frame member and a base member, on which various electrode patterns are formed. That is, the base member has internal electrodes for establishing electrical connections with the semiconductor element and thermoelectric module, and external electrodes for establishing electrical connections with external circuitry. Due to such an integrated arrangement of electrode patterns on the base member, it is possible to reduce the number of parts required for manufacturing the thermoelectric module package, which can be therefore manufactured with ease and at a relatively low cost. Incidentally, the thermoelectric module package can be produced by integrally combining a frame and a base together.

13 Claims, 22 Drawing Sheets

THERMOELECTRIC MODULE PACKAGE

BACKGROUND OF THE INVENTION

1. Field of the Invention

This invention relates to semiconductor elements such as semiconductor lasers used in optical communication apparatuses, and in particular, to packages for storing thermoelectric modules performing temperature controls on semiconductor elements.

2. Description of the Related Art

Recently, there are increasing needs for performing high-speed communications of large amounts of data or information as technologies regarding network systems such as the Internet have been rapidly developed and spread worldwide. Large amounts of data or information can be transmitted at a high speed by way of existing optical fiber networks, which are rapidly expanded and are frequently used in recent years. That is, so-called broadband optical networking technologies such as wavelength division multiplexing (WDM) and dense wavelength division multiplexing (DWDM) are adapted to multiplexing over channels with respect to optical signals or beams transmitted via a single optical fiber. This realizes high-speed bidirectional communications of large amounts of data or information.

Normally, data or information transmitted over optical fibers are signals that are produced by modulating laser beams, which are radiated (or emitted) from so-called optical semiconductor modules, i.e., electronic devices storing semiconductor lasers. In addition, optical semiconductor modules are also used in optical amplifiers that amplify intensities of signals at intermediate points in transmissions of data or information using optical fibers. Oscillation wavelengths of semiconductor lasers may be greatly affected by temperature; therefore, it is essential to strictly control the temperature of semiconductor lasers during operation. For temperature control, it is possible to use thermoelectric modules or thermoelectric coolers (TEC), which may incorporate numerous Peltier elements.

Containers storing electronic components such as semiconductor lasers and thermoelectric coolers are generally called packages, an example of which is shown in FIG. 21 and FIGS. 22A and 22B, wherein FIG. 21 shows essential parts for assembling a package, and FIGS. 22A and 22B show assembled states of the package. That is, an optical semiconductor module package 60 is mainly constituted by a frame 61, a window holder 62, a base 63, a seal ring 64, ceramic field through members 65, a pair of leads 66, and a cover (not shown). Herein, the frame 61, base 63, ceramic field through members 65, leads 66, and seal ring 64 together with brazing (or soldering) materials (not shown) are combined together as shown in FIG. 22A and are subjected to a heating process.

Thus, the window holder 62 is brazed to one side wall of the frame 61, and the base 63 is fixed to the lower surface of the frame 61 as a base plate by brazing. In addition, a pair of the ceramic field through members 65 are fixed to cutout portions formed on opposite side walls of the frame 61 by brazing. Furthermore, a pair of the leads 66 are attached onto the ceramic field through members 65 by brazing, and the seal ring 64 is brazed onto the ceramic field through members 65 and the frame 61. Then, an electronic component such as a thermoelectric cooler 67 and a semiconductor laser (not shown), or an optical system, is installed and stored in the frame 61, which is then placed in an atmosphere of nitrogen gas. Thereafter, the cover (not shown) is welded onto the seal ring 64, so that the package 60 is formed. Thus, it is possible to produce an optical semiconductor module.

In the above, the ceramic field through members 65 are formed using ceramic materials having wires 65a. Specifically, green sheets composed of aluminum oxide ($Al_2O_3$) and binders are formed in prescribed shapes, on which prescribed wires are sintered. Herein, the thermoelectric cooler 67 is arranged between the semiconductor laser and the base 63, so that heat generated by the semiconductor laser is actively radiated (or emitted) outside. Therefore, the base 63 is made of a prescribed material (e.g., CuW) having high thermal conduction. In addition, both the frame 61 and the window holder 62 are made of prescribed materials having small coefficients of thermal expansion, such as iron-nickel-cobalt (FeNiCo) alloy called "Kovar" (trademark).

The aforementioned optical semiconductor module has problems in that it requires a relatively large number of parts, each of which should be specifically processed, and expensive materials are therefore required, increasing the overall manufacturing cost thereof. In addition, numerous parts are assembled together by respective brazing at high temperature, which results in a reduction of yield in manufacture. Furthermore, due to troublesome operations performed in high-temperature conditions, it is necessary to use a specific assembling machine that is expensive, which inevitably raises the manufacturing cost of packages.

In addition, there is another problem in that complicated wiring is required in an optical semiconductor module using ceramic field through members. Furthermore, a heatsink is arranged to join the lower surface of a base made of CuW material, by which heat generated by a semiconductor laser is radiated to the outside. This results in a relatively low heat radiation efficiency, and therefore it is difficult to rapidly radiate heat to the outside.

SUMMARY OF THE INVENTION

It is an object of the invention to provide a thermoelectric module package for storing a semiconductor element such as a semiconductor laser, and a thermoelectric module (TEC: thermoelectric cooler) for performing temperature control on the semiconductor element, in which the number of parts can be reduced and which can be manufactured with ease.

A thermoelectric module package of this invention is designed to store a thermoelectric module for controlling the temperature of a semiconductor element (e.g., a semiconductor laser) having high output power, and is mainly constituted by a frame member and a base member, on which various electrode patterns are formed. That is, the base member has internal electrodes for establishing electrical connections with the semiconductor element and thermoelectric module, and external electrodes for establishing electrical connections with external circuitry. Due to such an integrated arrangement of electrode patterns formed on the base member, it is possible to reduce the number of parts required for manufacturing the package, which can be therefore manufactured with ease and at a relatively low cost.

In the above, the thermoelectric module package is not necessarily constituted by a frame member and a base member, which are provided independently of each other, and it can be constituted by integrally combining the frame and the base together, thus further reducing the number of parts required for manufacturing the package.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

That is, the present invention is applied to optical semiconductor modules, wherein a first embodiment is directed to a package in which a frame member and a base member are formed independently of each other, and a second embodiment is directed to a package in which a frame member and a base member are integrally formed together.

1. First Embodiment

Figure 1A:
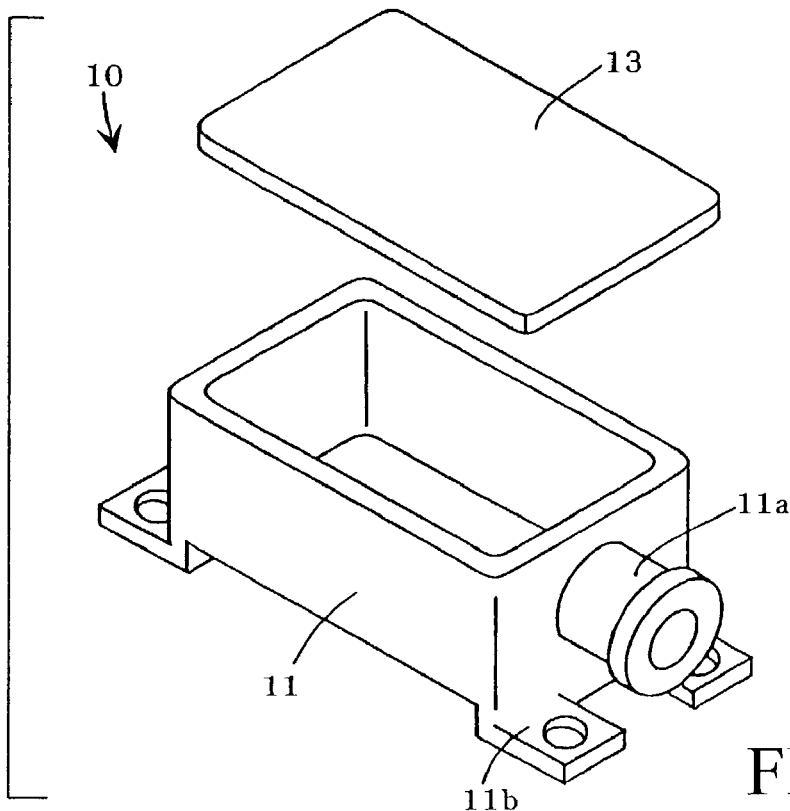
FIG. 1 is an exploded perspective view showing essential parts of an optical semiconductor module package, which are to be assembled together.
Figure 1B:
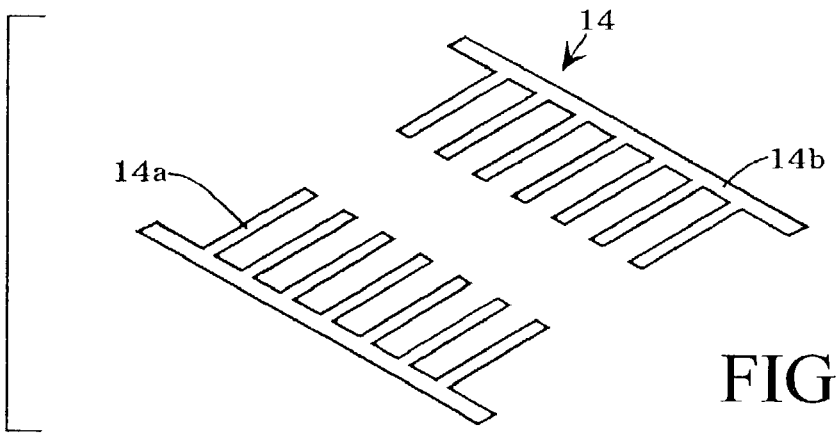
Figure 1C:
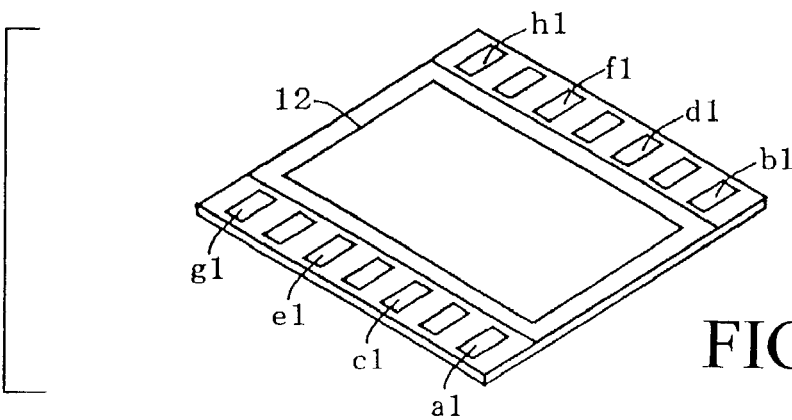
Figure 2:
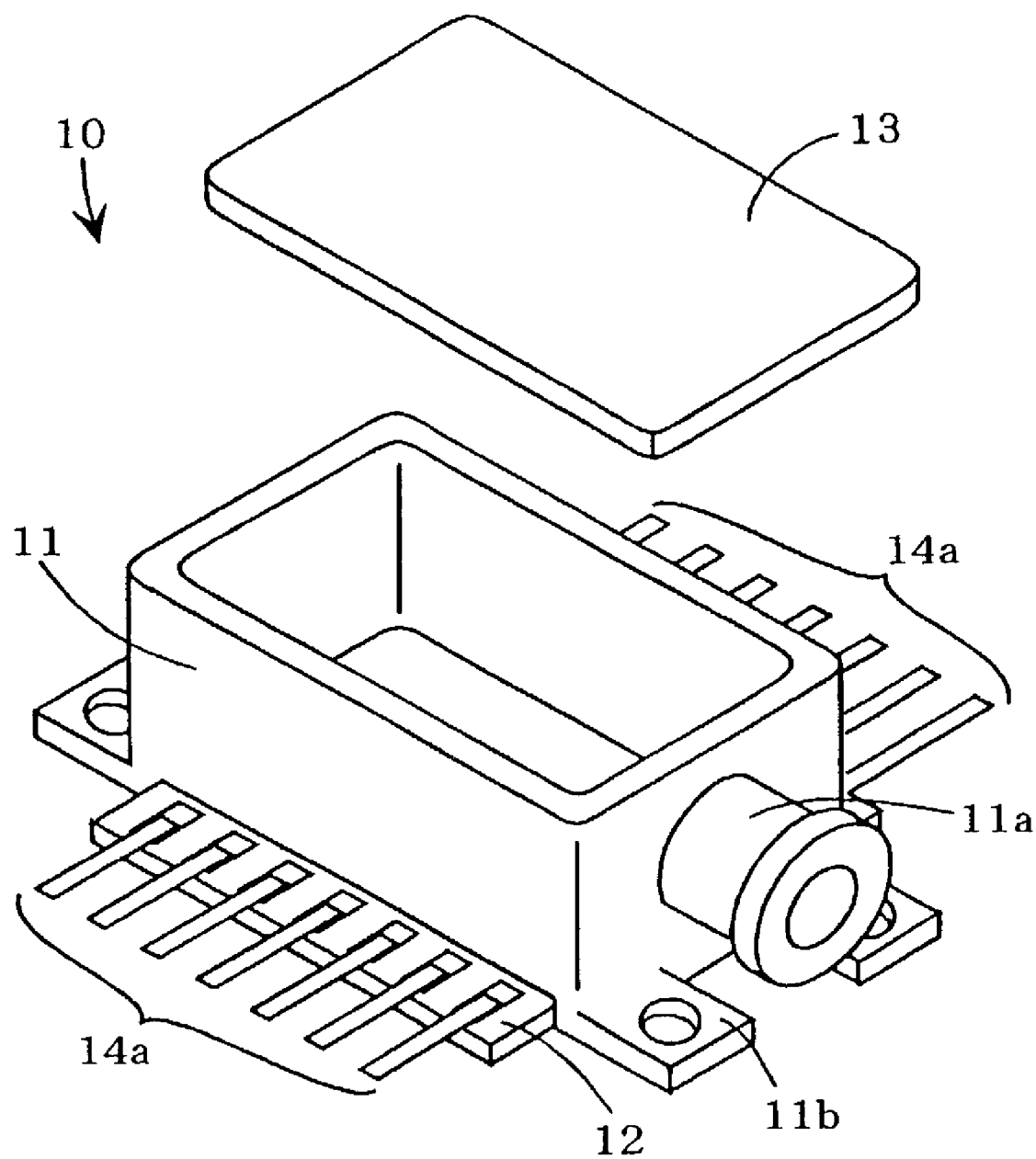
FIG. 2 is a perspective view showing the overall constitution of the optical semiconductor module package in which some parts thereof are assembled together.
Figure 3A:
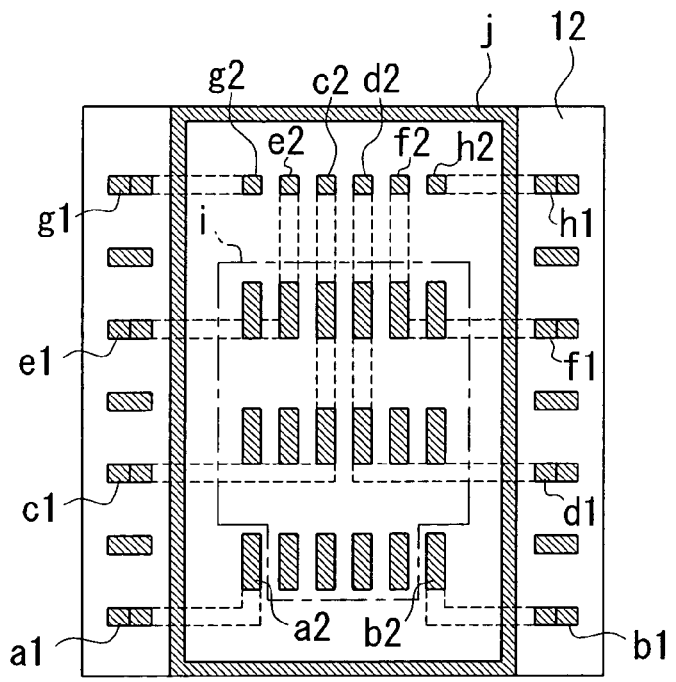
FIG. 3A is an upper view showing electrode patterns formed on the surface of a base member.
Figure 3B:
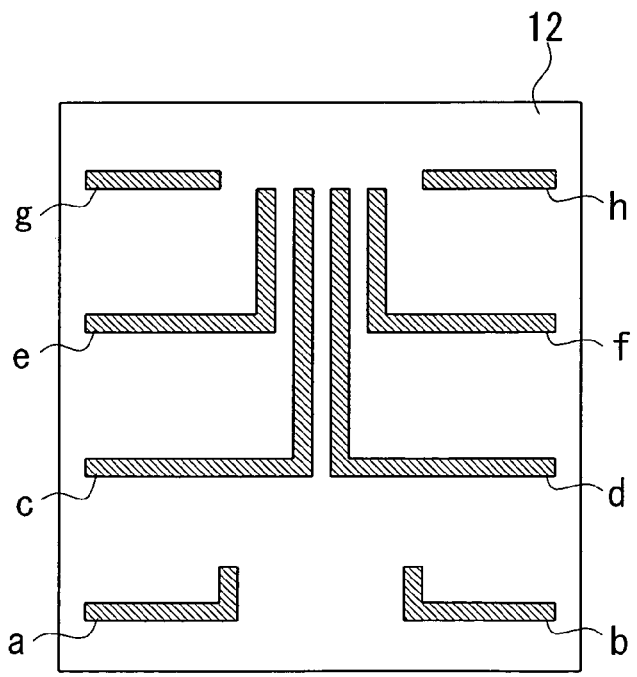
FIG. 3B is an upper view showing conduction patterns formed inside of the base member.

In accordance with the first embodiment of the invention, an optical semiconductor module package, in which a frame member and a base member are formed independently of each other, and an optical semiconductor module using this package, will be described with reference to FIGS. 1 to 9, wherein FIG. 1 is an exploded perspective view showing essential parts used for constituting a package of the first embodiment, and FIG. 2 is a perspective view showing the overall constitution of the package whose parts are substantially assembled. FIGS. 3A and 3B are upper views showing electrode and conduction patterns to be formed on a base member; specifically, FIG. 3A shows electrode patterns formed on the surface of a base member, and FIG. 3B shows conduction patterns formed inside of the base member.

Figure 4A:
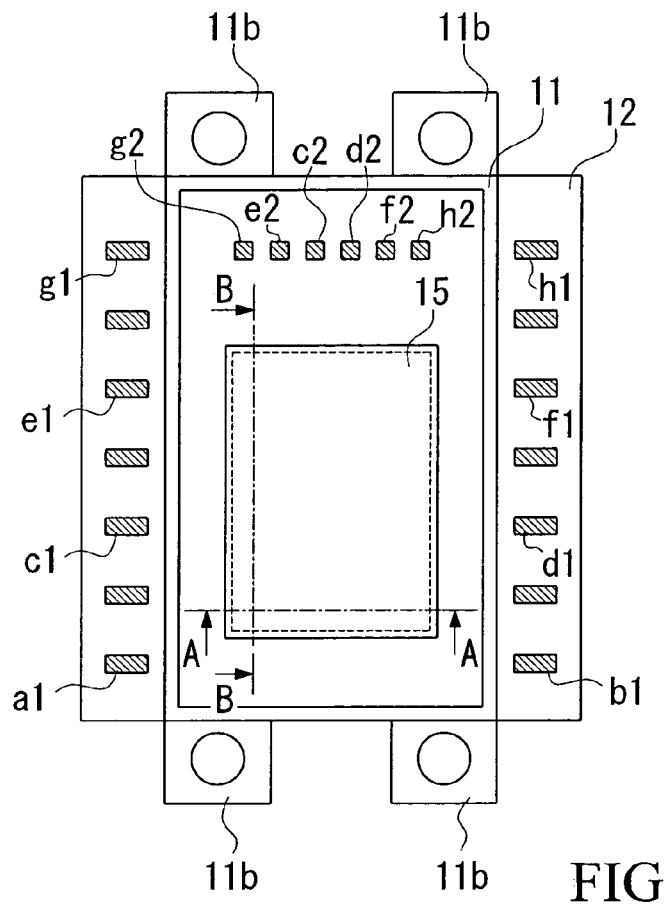
FIG. 4A is an upper view showing electrode patterns formed on the surface of the base member on which a thermoelectric module is mounted.
Figure 4B:
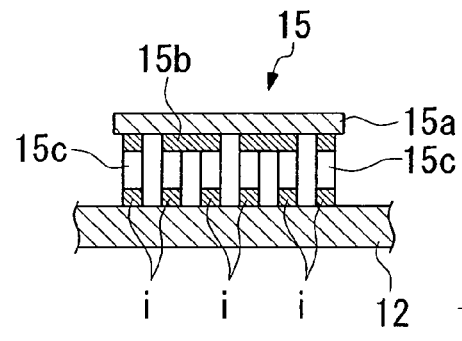
FIG. 4B is a cross sectional view taken along line A—A in FIG. 4A.
Figure 4C:
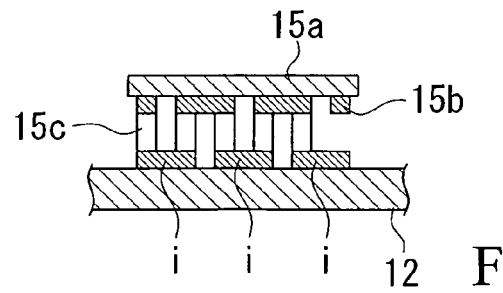
FIG. 4C is a cross sectional view taken along line B—B in FIG. 4A.
Figure 5A:
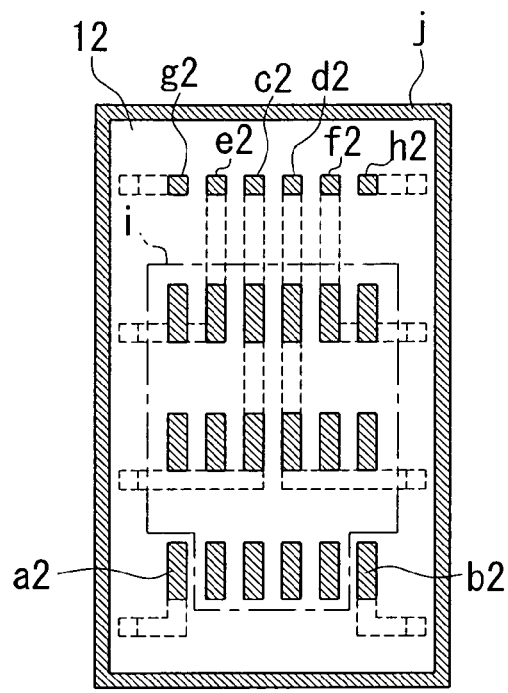
FIG. 5A is an upper view showing electrode patterns formed on the surface of a base member that is modified compared with the base member shown in FIG. 3A.
Figure 5B:
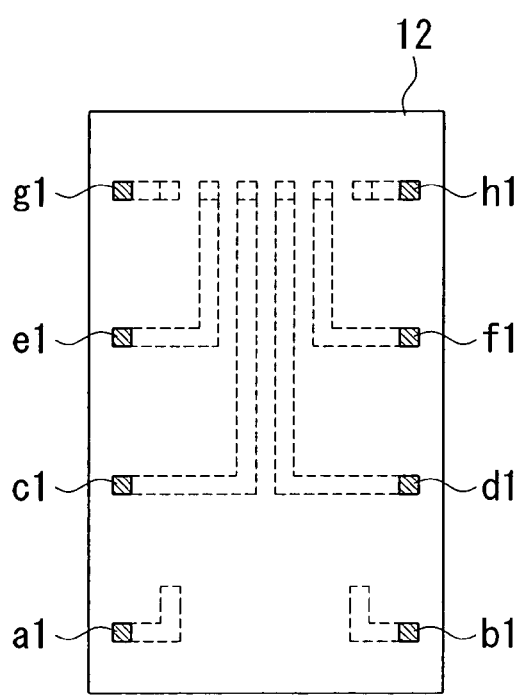
FIG. 5B is a lower view showing conduction patterns formed on the lower surface of the base member shown in FIG. 5A.
Figure 6:
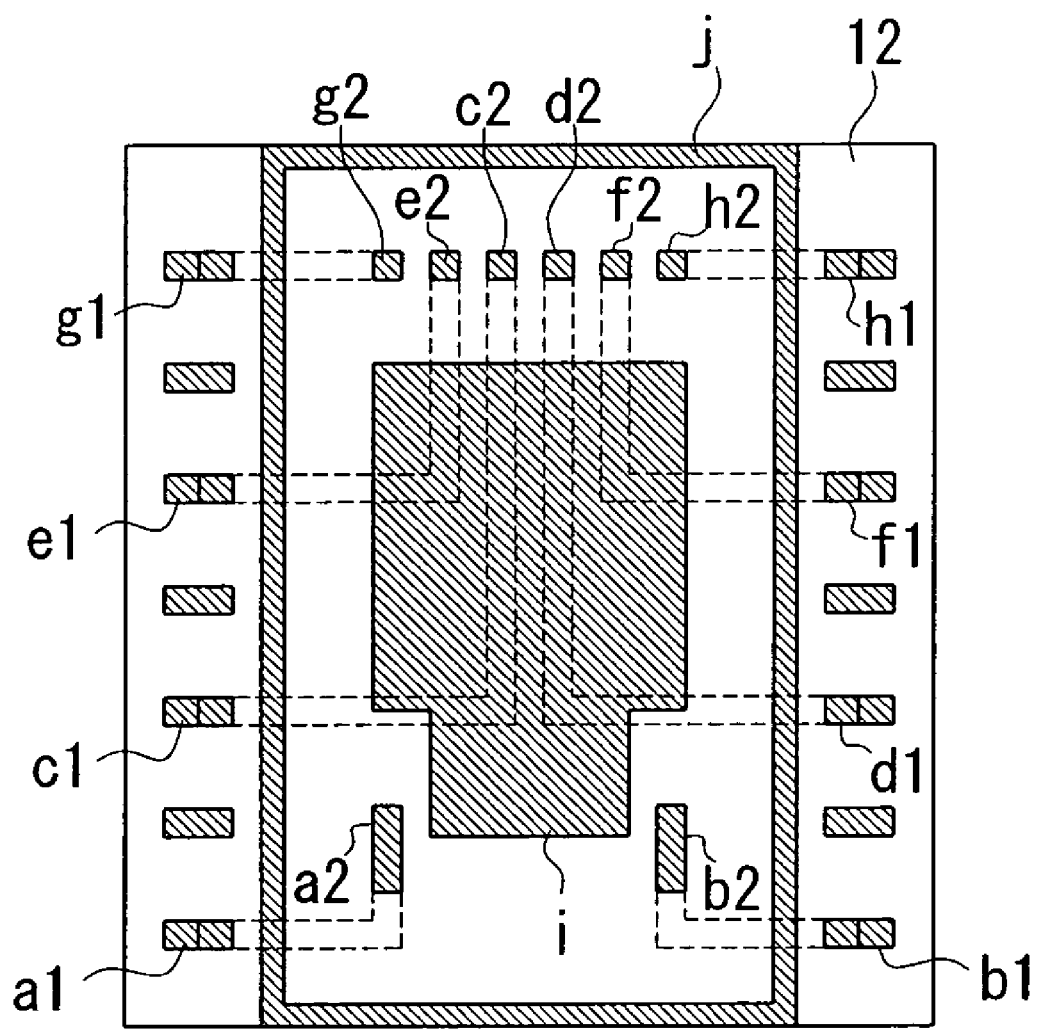
FIG. 6 is an upper view showing electrode patterns formed on the surface of a base member that allows installation of a thermoelectric module having a lower substrate.

FIGS. 4A to 4C show a frame member joining a base member, with which a thermoelectric module is joined. Specifically, FIG. 4A is an upper view; FIG. 4B is a cross sectional view taken along line A—A in FIG. 4A; and FIG. 4C is a cross sectional view taken along line B—B in FIG. 4A. FIGS. 5A and 5B show a modified example of the base member, wherein FIG. 5A is an upper view showing electrode patterns formed on the surface of the base member, and FIG. 5B is a lower view showing conduction patterns formed on the lower surface of the base member. FIG. 6 is an upper view showing electrode patterns formed on the surface of the base member joined together with a thermoelectric module having a lower substrate.

Figure 7A:
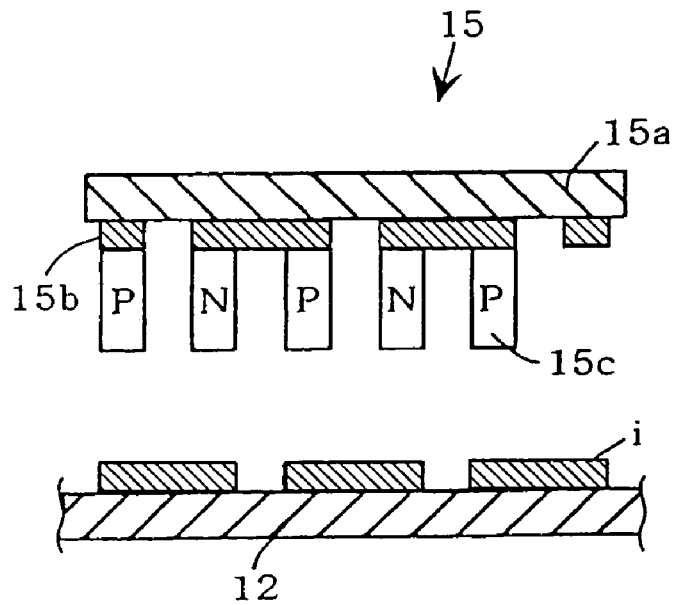
FIG. 7A is a cross sectional view showing a thermoelectric module not having a lower substrate mounted on a base member.
Figure 7B:
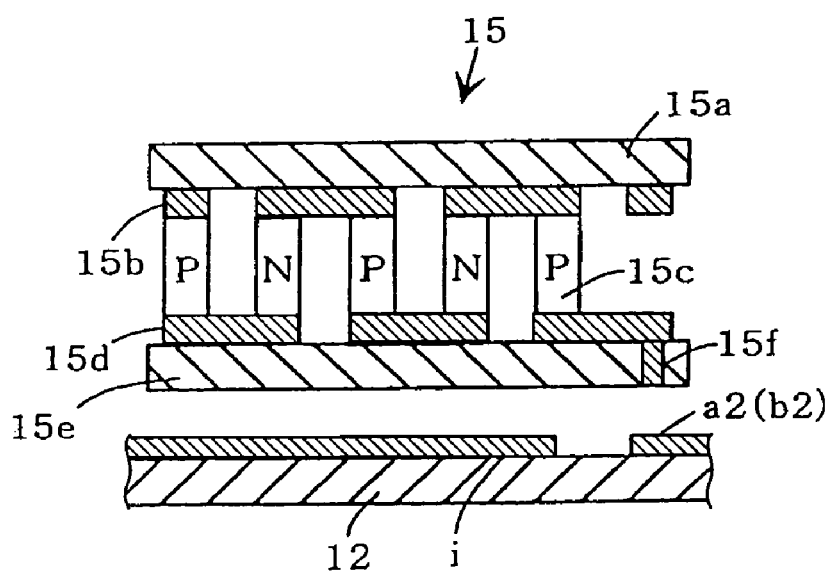
FIG. 7B is a cross sectional view showing a thermoelectric module having a lower substrate mounted on a base member.
Figure 8A:
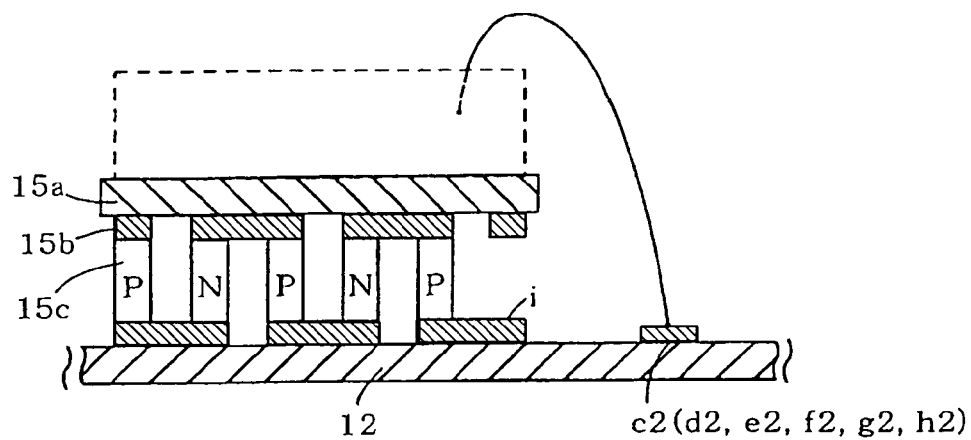
FIG. 8A is a cross sectional view showing a semiconductor element arranged on a thermoelectric module subjected to wire bonding with internal electrodes of a base member.
Figure 8B:
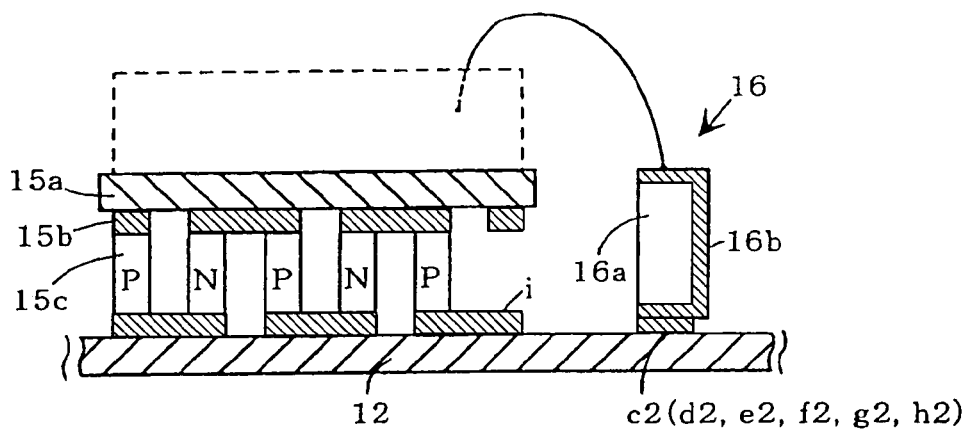
FIG. 8B is a cross sectional view showing a bonding device arranged in proximity to the thermoelectric module mounted on the base member.
Figure 8C:
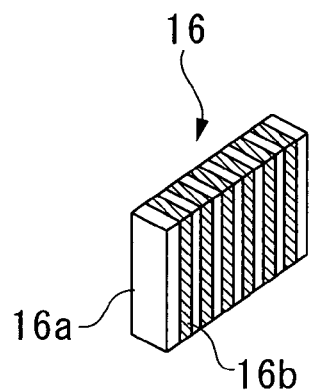
FIG. 8C is a perspective view showing the appearance of the bonding device.

FIGS. 7A and 7B show thermoelectric modules joining electrode patterns of base members, wherein FIG. 7A is a cross sectional view showing a thermoelectric module not having a lower substrate joining the surface of a base member, and FIG. 7B is a cross sectional view showing a thermoelectric module having a lower substrate joining the surface of a base member. FIGS. 8A and 8B show a semiconductor included in a thermoelectric module connected with internal electrodes formed on a base member by wire bonding, wherein FIG. 8A is a cross sectional view showing a normal condition in which the semiconductor element of the thermoelectric module is bonded onto the base member; FIG. 8B is a cross sectional view showing a bonding member arranged in proximity to the thermoelectric module to be bonded onto the base member; and FIG. 8C is a perspective view showing the bonding member.

Figure 9A:
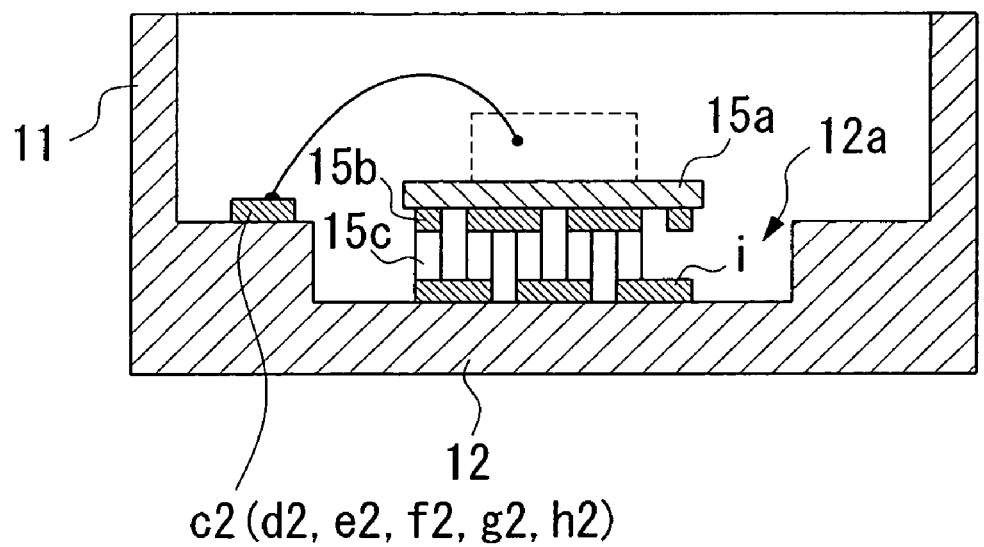
FIG. 9A is a cross sectional view showing a semiconductor element mounted on a thermoelectric module not having a lower substrate joining internal electrodes formed on a base member.
Figure 9B:
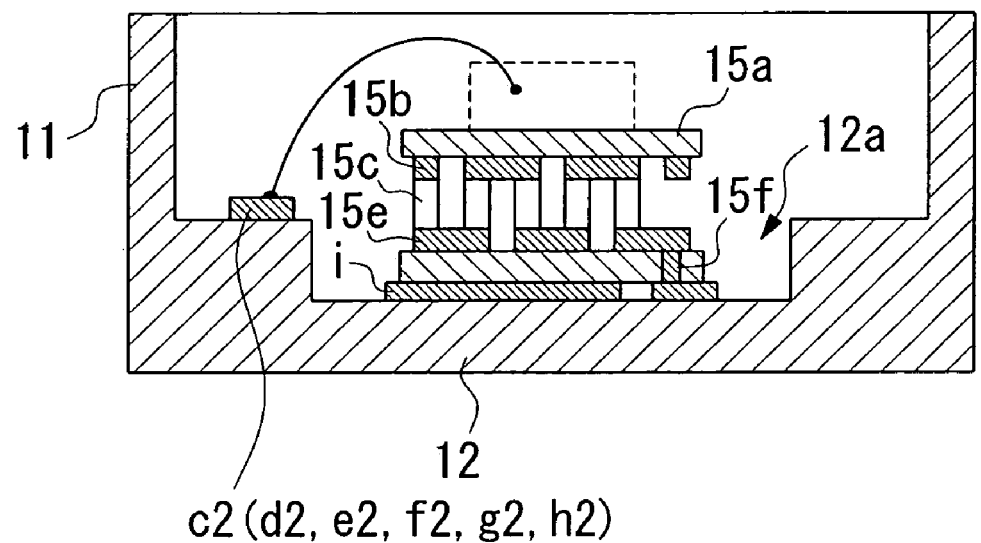
FIG. 9B is a cross sectional view showing a semiconductor element mounted on a thermoelectric module having a lower substrate joining internal electrodes formed on a base member.

FIGS. 9A and 9B show another example in which semiconductor elements included in thermoelectric modules are connected with internal electrodes formed on base members by wire bonding, wherein FIG. 9A is a sectional view showing a thermoelectric module not having a lower substrate joining a base member, and FIG. 9B is a sectional view showing a thermoelectric module having a lower substrate joining a base member.

(1) Optical Semiconductor Module Package

As shown in FIGS. 1 and 2, an optical semiconductor module package 10 is constituted by a frame member 11 roughly having a box-like shape, in which a window holder 11a roughly having a cylindrical shape is attached to one side wall, a base member 12 acting as a base plate for the frame member 11, and a cap member acting as a cover for the frame member 11. The frame member 11 and the base member 12 are integrally interconnected together by brazing or by soldering. A thermoelectric module 15 (see FIG. 4B) is attached onto the surface of the base member 12, and a semiconductor laser or an optical system is arranged on the thermoelectric module 15. In addition, the cap member 13 joins the frame member 11 by seam welding, so that an optical semiconductor module is completely produced.

The frame member 11 is composed of FeNiCo alloy (e.g., Kovar) having a relatively small coefficient of thermal expansion, which is subjected to metal injection molding (MIM) or casting, thus forming the frame member 11 roughly having a box-like shape, in which pairs of fixing portions 11b are formed on base portions of side walls respectively. The window holder 11a can be formed independently of the frame member 11 and joins the frame member 11 thereafter. Alternatively, the window holder 11a can be integrally formed together with the frame member 11 by using the same material. It is preferable that the fixing portions 11b be integrally formed together with the frame member 11. Similar to the frame member 1, the cap member 13 is composed of FeNiCo alloy (e.g., Kovar) having a relatively small coefficient of thermal expansion, wherein a thin plate of FeNiCo alloy is subjected to press punching and is made planar.

The base member 12 is composed of a multilayer substrate whose base material corresponds to ceramic material such as alumina ($Al_2O_3$), aluminum nitride (AlN), and silicon carbide (SiC), for example. Prescribed conduction patterns 'a' to 'h' shown in FIG. 3B is embedded inside of the base member 12. The surface of the base member 12 is formed with external electrode patterns a1 to h1, which conduct to the conduction patterns a to h respectively, internal electrode patterns a2 to h2, a thermoelectric module metallizing portion i, and a frame member metallizing portion j.

Each of the conduction patterns a–h, external electrode patterns a1–h1, internal electrode patterns a2–h2, thermoelectric module metallizing portion i, and frame member metallizing portion j is composed of a prescribed metal such as Cu, W, Mo, Mn, and Ag or is composed of a prescribed alloy composed of these metals. Ni plating is effected on the external electrode patterns a1–h1, thermoelectric module metallizing portion i, frame member metallizing portion j, and internal electrode patterns a2–h2 respectively, wherein Au plating is further effected in addition to Ni plating as necessary.

The frame member 11 is brazed to the base member 12 constituted by the aforementioned multilayer substrate by using a prescribed metal material such as Ag alloy, Cu alloy, and Au alloy. Alternatively, the frame member 11 is soldered to the base member 12 by using a prescribed alloy such as AuSn alloy, AuSi alloy, and AuGe alloy. That is, the frame member 11 and the base member 12 are integrally combined together by brazing or by soldering, thus completely producing a package 10. Leads 14a are brazed to the aforementioned electrode patterns a1–h1, which are formed on the surface of the base member 12, by using a prescribed metal material such as Ag alloy, Cu alloy, and Au alloy. Alternatively, they are soldered to the external electrode patterns a1–h1 by using a prescribed alloy such as AuSn alloy, AuSi alloy, and AuGe alloy.

As shown in FIG. 1, the lead member 14 is made by using a thin plate composed of a prescribed alloy such as FeNiCo alloy (e.g., Kovar) and Cu alloy or a prescribed metal material such as Cu, which is formed in a comb-like shape whose teeth are then subjected to cutting processes to form leads 14a, which are interconnected together by interconnecting portions 14b. Plating is effected on the lead member 14 having a comb-like shape as necessary. In addition, comb teeth (i.e., leads) 14a join the external electrode patterns a1–h1 and other electrodes formed therebetween. Then, the interconnecting portions 14b are removed by cutting base portions of the comb teeth 14a, which are then separated and remain as leads.

(2) Optical Semiconductor Module

The thermoelectric module 15 joins the thermoelectric module metallizing portion i of the base member 12 shown in FIG. 4A, wherein the thermoelectric module 15 is constituted by numerous Peltier elements 15c sandwiched between an upper substrate 15a and a lower substrate corresponding to the base member 12. Specifically, Peltier elements 15c are electrically connected in series or in parallel between electrode patterns (or conduction layers) 15b formed on the upper surface 15a and an electrode pattern of the metallizing portion i formed on the lower substrate. The Peltier elements 15c are alternately constituted by p-type semiconductor compound elements and n-type semiconductor compound elements. In order to reduce electric resistances of the electrode patterns, it is possible to insert thin Cu elements, matching the electrode pattern of the metallizing portion i, between the metallizing portion i and the Peltier elements 15c.

The aforementioned Peltier elements 15c are electrically connected in series in an order alternately arranging p-type and n-type thereof, wherein they are soldered to the electrode patterns 15b of the upper substrate 15a and the electrode pattern of the metallizing portion i of the base member 12 by using a prescribed solder material such as SnSb alloy and SnAsCu alloy. The aforementioned thermoelectric module is one kind of an electronic device called a thermoelectric cooler (TEC). Similar to the lower substrate (corresponding to the base member 12), the upper substrate 15a is composed of a prescribed ceramic material such as alumina ($Al_2O_3$), aluminum nitride (AlN), and silicon carbide (SiC), wherein the electrode patterns 15b are formed on the surface of the upper substrate 15a by Cu plating and etching. It is preferable to further effect Ni plating on the Cu plating. In addition, it may be possible to further effect Au plating on the Ni plating.

A semiconductor laser (not shown) is arranged on the thermoelectric module 15, and an optical system (not shown) is arranged on the optical axis of the semiconductor laser. Then, the cap member 13 is arranged on the upper portion of the frame member 11. Herein, the cap member 13 is brazed to the frame member 11 by using a prescribed brazing material such as Ag alloy, Cu alloy, and Au alloy; or the cap member 13 is soldered to the frame member 11 by using a prescribed soldering material such as SuASn alloy, AuSi alloy, and AuGe alloy; or the cap member 13 joins the frame member 11 by seam welding. Thus, it is possible to completely produce an optical semiconductor module.

(3) Manufacturing Process (a) EXAMPLE 1

Next, descriptions will be given with respect to a concrete example of the package 10 having the aforementioned structure, and a concrete example of an optical semiconductor module using the package 10 in accordance with manufacturing steps.

First, there are provided two ceramic green sheets, each of which is mainly composed of a prescribed ceramic material such as alumina ($Al_2O_3$), aluminum nitride (AlN), and silicon carbide (SiC). By using substantially the same metal mold and/or punching machine, a prescribed number of guide holes for positioning are punched on the two ceramic green sheets respectively. Then, the aforementioned conduction patterns a–h are formed on one ceramic green sheet by screen printing.

In addition, various patterns shown in FIG. 3A are formed on another ceramic green sheet by screen printing, wherein there are formed through hole conductors, which conduct to the aforementioned conduction patterns a–h shown in FIG. 3B, the external electrode patterns a1–h1 and other electrode elements formed therebetween, the internal electrode patterns a2–h2, the thermoelectric module metallizing portion i, and frame member metallizing portion j. By using the aforementioned guide holes, the two ceramic green sheets are subjected to prescribed positioning and are stacked, wherein they are subjected to thermocompression bonding under prescribed conditions, where temperature ranges from 80° C. to 150° C. and pressure ranges from 50 kg/cm$^2$ to 250 kg/cm$^2$, so that they are integrally combined together, thus forming a ceramic green sheet laminated structure (i.e., a multilayer substrate). The multilayer substrate is sintered to form the base member 12. Incidentally, Ni plating is effected on surfaces of metallizing layers, which are exposed on the surface of the substrate, as necessary.

The frame member 11 having roughly a box-like shape, in which pairs of fixing portions 11b are formed on base portions of opposite side walls, is produced by effecting MIM (metal injection molding) or casting on FeNiCo alloy (e.g., Kovar) having a relatively small coefficient of thermal expansion. In addition, the window holder 11a having roughly a cylindrical shape, which is produced by MIM or casting, integrally joins a prescribed side wall of the frame member 11. Herein, it is possible to integrally form the window holder 11a together with the frame member 11 in advance by MIM or casting. Similar to the frame member 11, FeNiCo alloy is subjected to press punching to produce the "planar" cap member 13. Furthermore, a thin plate composed of FeNiCo alloy (e.g., Kovar), Cu alloy, or other metals such as Cu is subjected to press working to produce the lead member 14 having a comb-like shape consisting of the comb teeth (or leads) 14a and interconnecting portions 14b.

The base member 12 produced by the aforementioned multilayer substrate is arranged inside of a prescribed instrument; and then, the frame member 11 is arranged on the frame member metallizing portion j by brazing using a prescribed material such as Ag alloy. In addition, the comb teeth 14a of the lead member 14 are arranged on the external electrode patterns a1–h1 and other electrode elements formed therebetween on the surface of the base member 12.

Then, the instrument is subjected to heating process, so that the package 10 is produced in such a way that the frame member 11 joins the base member 12, and the leads 14a of the lead member 14 respectively join the external electrode patterns a1–h1 and other electrode elements formed therebetween on the base member 12. In this case, both the frame member 11 and the leads 14a join the base member 12 by brazing using a prescribed material such as Cu alloy and Au alloy or by soldering.

In the above, it is possible to join the leads 14a and the base member 12 after the frame member 11 is joined to the base member 12. Alternatively, it is possible to join the frame member 11 and the base member 12 after the leads 14a are joined to the base member 12. Then, Ni plating or Pd plating is effected onto the frame member 11 and leads 14a as well as the internal electrode patterns a2–h2 and thermoelectric module metallizing portion i formed on the surface of the base member 12 as necessary. Thereafter, Au plating is further effected thereon.

As shown in FIG. 7A, the electrode patterns 15b are formed on the surface of the upper substrate 15a, which is composed of a prescribed ceramic material such as alumina ($Al_2O_3$), aluminum nitride (AlN), and silicon carbide (SiC), by Cu plating and etching. In addition, Ni plating and Au plating are further effected on Cu plating. Peltier elements 15c are soldered onto the upper substrate 15a via the electrode patterns 15b (corresponding to conduction layers), wherein they are arranged by alternately changing polarities thereof between p-type and n-type and are connected together in series to produce a semi-finished product of the thermoelectric module 15. Herein, the thermoelectric module 15 does not arrange conduction layers on lower ends of the Peltier elements 15c (opposite to the electrode patterns 15b); however, it is preferable to arrange conduction layers of a prescribed material such as Cu on lower ends of the Peltier elements 15c. In this case, the thermoelectric module has arranged a single substrate at one side only and is joined to the base member 12.

The Peltier elements 15c of the thermoelectric module 15 are arranged to be electrically connected in series with the thermoelectric module metallizing portion i and internal electrodes a2 and b2 on the base member 12 via solders, which are then heated and melted at a prescribed temperature. Thus, the Peltier elements 15c are arranged by alternately changing polarities between p-type and n-type and join the electrode patterns 15b formed on the upper substrate 15a. That is, the thermoelectric module (i.e., thermoelectric cooler, TEC) 15 is produced in such a way that the Peltier elements 15c join the thermoelectric module metallizing portion i and the internal electrodes a2 and b2 on the base member 12. Incidentally, it is possible to perform a soldering process, in which the Peltier elements 15c are soldered onto the upper substrate 15a, and a joining process in which the Peltier elements 15c join the thermoelectric module metallizing portion i and the internal electrodes a2 and b2 on the base member 12.

A semiconductor element (not shown), such as a semiconductor laser or a laser diode (LD), a photodiode (PD), and a thermistor, is arranged on the thermoelectric module 15, wherein a lens system (not shown) is further arranged on the optical axis of the semiconductor laser to fix a laser, for example. Then, the semiconductor element is joined to the internal electrode patterns a2–h2 formed on the surface of the base member 12 by wire bonding. Thereafter, the cap member 13 is arranged to cover the opening of the frame member 11 and is joined together with the frame member 11 in an airtight manner by seam welding.

Thereafter, the interconnecting portions 14b of the lead member 14 are cut out by cutting the base portions of the leads 14a; thus, it is possible to finish producing the optical semiconductor module shown in FIG. 2. Herein, a heatsink (not shown) is arranged below the base member 12 via silicone grease, and it is screwed to the base member 12; thus, it is possible to produce the optical semiconductor module having superior heat radiation (or emission) characteristics.

(b) EXAMPLE 2

Next, a description will be given with respect to a manufacturing process of the package 10 having the aforementioned structure in accordance with example 2. Similar to the aforementioned example 1, there is provided the base member 12 in which the conduction patterns a–h are formed in conduction with through hole conductors, and on which the external electrode patterns a1–h1 and other electrode elements formed therebetween, the internal electrode patterns a2–h2, the thermoelectric module metallizing portion i, and frame member metallizing portion j are formed. In addition, Ni plating and Au plating are effected on metallizing layers of the base member 12 as necessary.

Similar to the aforementioned Example 1, the thermoelectric module 15 having a single substrate at one side thereof is produced, wherein the Peltier elements 15c are arranged by alternately changing polarities thereof and are electrically connected in series with the thermoelectric module metallizing portion i, and the internal electrode elements a2 and b2 on the base member 12 via solders. Then, a semiconductor element (not shown) such as a semiconductor laser or a laser diode (LD), a photodiode (PD), and a thermistor, is arranged on the thermoelectric module 15, wherein a lens system is arranged on the optical axis of the semiconductor laser to fix a laser, for example.

Similar to the aforementioned Example 1, there are provided the frame member 11 having roughly a box-like shape, in which the window holder 11a having roughly a cylindrical shape is arranged on one side wall and pairs of fixing portions 11b are arranged on base portions of opposite side walls, the "planar" cap member 13, and the lead member 14 having the comb teeth 14a and interconnecting portions 14b. In addition, the base member 12 is arranged inside of the foregoing instrument, and the frame member 11 is arranged on the frame member metallizing portion j via joining materials on the base member 12. Furthermore, the comb teeth 14a of the lead member 14 are arranged on the external electrode patterns a1–h1 and other electrode elements formed therebetween on the base member 12 via joining materials.

Then, the example 2 is subjected to heating process; thus, it is possible to produce the package 10 in which the frame member 11 joins the base member 12, and the leads 14a join the external electrode patterns a1–h1 and other electrode elements formed therebetween on the base member 12. As materials for joining together the frame member 11 and the base member 12, it is necessary to use materials whose melting points are equal to or lower than melting points of the aforementioned joining materials (i.e., solders) for joining together the base member 12 and the thermoelectric module 15.

In the above, it is possible to join the leads 14a and the base member 12 after the frame member 11 is joined to the base member 12. Alternatively, it is possible to join the frame member 11 and the base member 12, which joins the leads 14a in advance. Moreover, it is possible to arrange a semiconductor element such as a laser diode, a photodiode, and a thermistor, as well as a lens system on the thermoelectric module 15 that is mounted on the base member 12, which joins the frame member 11.

The semiconductor element joins the internal electrode patterns a2–h2 formed on the surface of the base member 12 by wire bonding; and then, the cap member 13 is arranged on the upper portion of the frame member 11 to join the frame member 11 in an airtight manner by seam welding. In addition, the interconnecting portions 14b of the lead member 14 are cut out by cutting the base portions of the leads 14a; thus, it is possible to finish producing the optical semiconductor module shown in FIG. 2. Herein, a heatsink (not shown) is arranged below the base member 12 via silicone grease and is screwed to the base member 12; thus, it is possible to produce the optical semiconductor module having superior heat radiation (or emission) characteristics.

(4) Modifications

The first embodiment can be modified in various ways, examples of which will be described below.

(a) First Modification

In the first embodiment described above, the external electrode patterns a1–h1 are formed on the surface of the base member 12 and are connected with the leads 14a respectively. Herein, it is possible to form external circuit electrodes on the backside or side surface of the base member 12.

In this case, internal electrode patterns a2–h2, a thermoelectric module metallizing portion i, and a frame member metallizing portion j are formed on the surface of the base member 12 as shown in FIG. 5A, while external electrode patterns a1–h1 are formed on the backside of the base member 12 as shown in FIG. 5B. Thus, it is possible to produce a modified example of the base member 12 constituted by a multilayer substrate.

The aforementioned example eliminates the necessity of arranging the external electrode patterns a1–h1 on the surface of the base member 12, which can be therefore reduced in size in a planar shape. In addition, it becomes unnecessary to provide connections with the leads 14a, which may greatly simplify manufacture. Of course, it is possible to arrange leads with the aforementioned base member 12. Furthermore, the external electrode patterns a1–h1 are not necessarily formed on the backside of the base member 12 and can be formed on the side surface of the base member 12.

(b) Second Modification

The first embodiment produces a "semi-finished" product of the thermoelectric module 15 (see FIG. 7A) in which the Peltier elements 15c join the upper substrate 15a via the electrode patterns 15b. For this reason, the thermoelectric module metallizing portion i is formed on the surface of the base member 12 in such a way that the Peltier elements 15c are arranged by alternately changing polarities thereof between p-type and n-type and are electrically connected in series.

It is possible to modify the first embodiment as shown in FIG. 7B, wherein the thermoelectric module 15 is constituted by a pair of an upper substrate 15a and a lower substrate 15e sandwiching numerous Peltier elements 15c therebetween in such a way that the Peltier elements 15c joining the upper substrate 15a via the electrode patterns 15b are arranged by alternately changing polarities thereof between p-type and n-type and are electrically connected in series while electrode patterns 15d arranged substantially opposite to unjoined areas of the Peltier elements 15c joining with the electrode patterns 15b are formed on the lower substrate 15e. In this case, the thermoelectric module metallizing portion i is modified to substantially match the overall shape of the lower surface of the thermoelectric module 15 and is formed on the surface of the base member 12 as shown in FIG. 6. In addition, internal electrodes a2 and b2 (corresponding to power supply electrode patterns) are formed at prescribed positions in conformity with through holes 15f (in which conduction layers are formed) formed at prescribed positions penetrating through the lower substrate 15e of the thermoelectric module 15. Incidentally, plural metallizing layers (not shown) are formed on the backside of the lower substrate 15e opposite to an arrangement of the electrode patterns 15d in order to join the thermoelectric module metallizing portion i and the internal electrodes (or power supply electrode patterns) a2 and b2.

(c) Third Modification

In the first embodiment, the semiconductor element is arranged to join the internal electrodes c2–h2 formed on the surface of the base member 12 by wire bonding. However, the semiconductor element is arranged on the thermoelectric module 15 and is arranged higher than the internal electrodes c2–h2, which causes difficulties in performing wire bonding. Therefore, it is possible to modify the first embodiment in such a way that a wiring device 16 is arranged in proximity to the internal electrodes c2–h2 at substantially the same height of the thermoelectric module 15.

The wiring device 16 is constituted by arranging a plurality of plated layers 16b, composed on a prescribed metal material such as Cu and Ni, on a substrate 16a that is composed of a prescribed ceramic material such as alumina ($Al_2O_3$), aluminum nitride (AlN), and silicon carbide (SiC), which is shown in FIG. 8C. The plated layers 16b are soldered to the internal electrodes c2–h2 formed on the surface of the base member 12 as shown in FIG. 8B. As described above, the plated layers 16b of the wiring device 16 join the semiconductor element by wire bonding, which can be performed with ease because the wiring device 16 and the semiconductor element are arranged at substantially the same height.

(d) Fourth Modification

It may be possible to provide other means for reducing height differences between the semiconductor element and the internal electrodes c2–h2 formed on the surface of the base member 12. That is, as shown in FIGS. 9A and 9B, a hollow portion 12a is formed substantially at the center portion of the base member 12, so that the thermoelectric module 15 is arranged in the hollow portion 12a, while the internal electrodes c2–h2 are arranged on the step portion of the base member 12. This can reliably reduce height differences between the semiconductor element and the internal electrodes c2–h2, formed on the step portion of the base member 12, which can easily be joined to each other by wire bonding.

2. Second Embodiment

Figure 10:
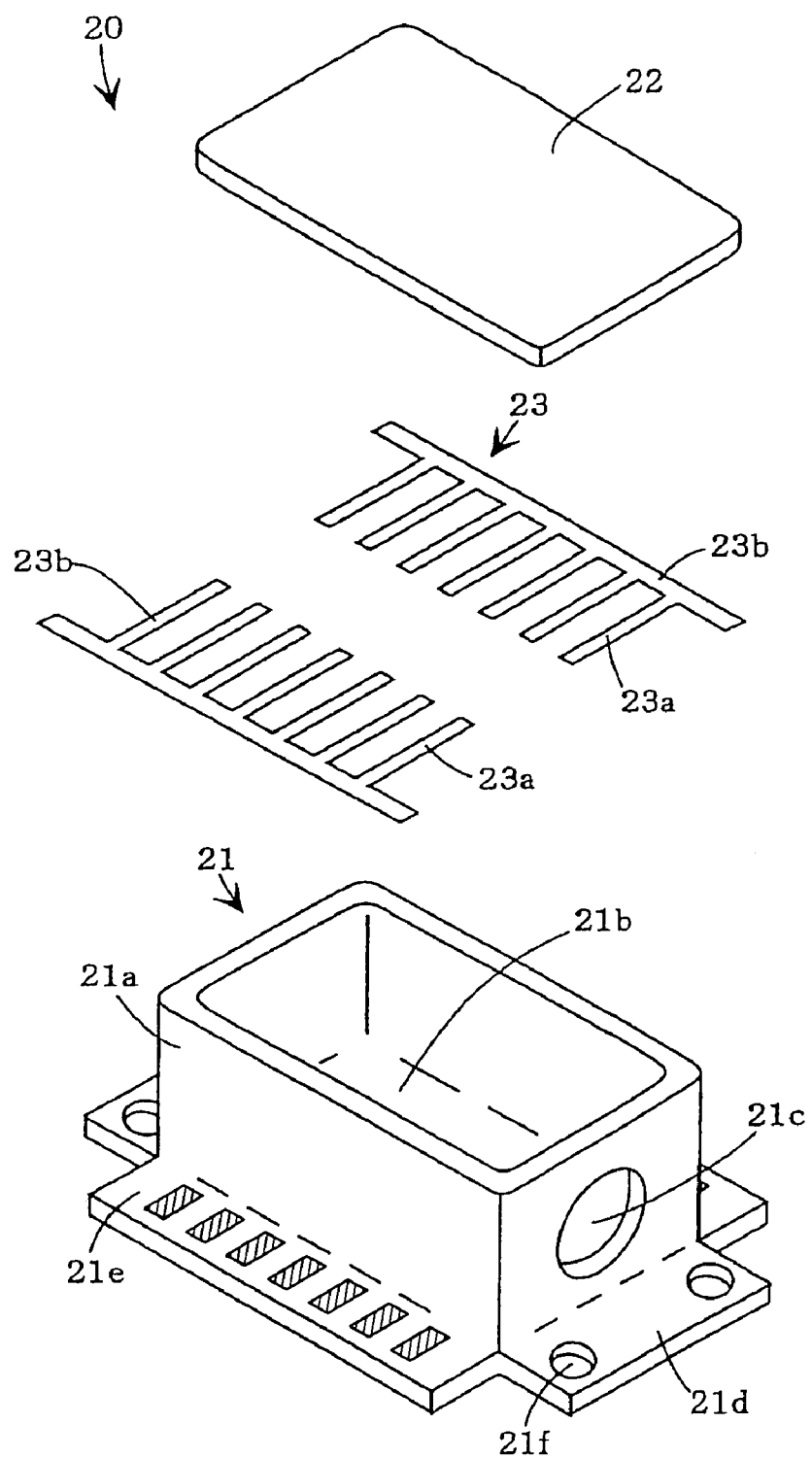
FIG. 10 is an exploded perspective view showing the overall constitution of a package whose parts are to be assembled together.
Figure 11:
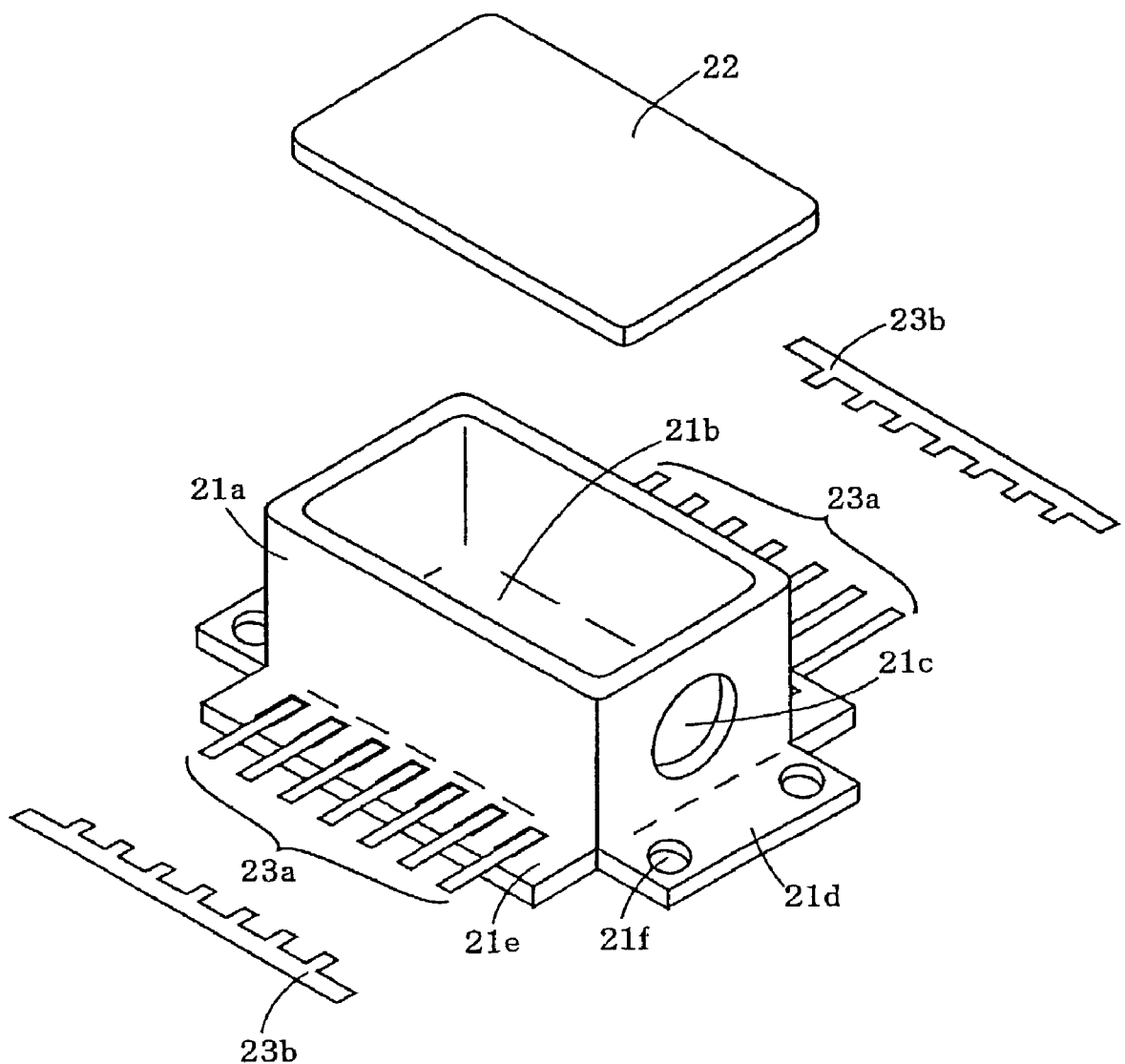
FIG. 11 is a perspective view showing a partially assembled state of the package shown in FIG. 10.
Figure 12:
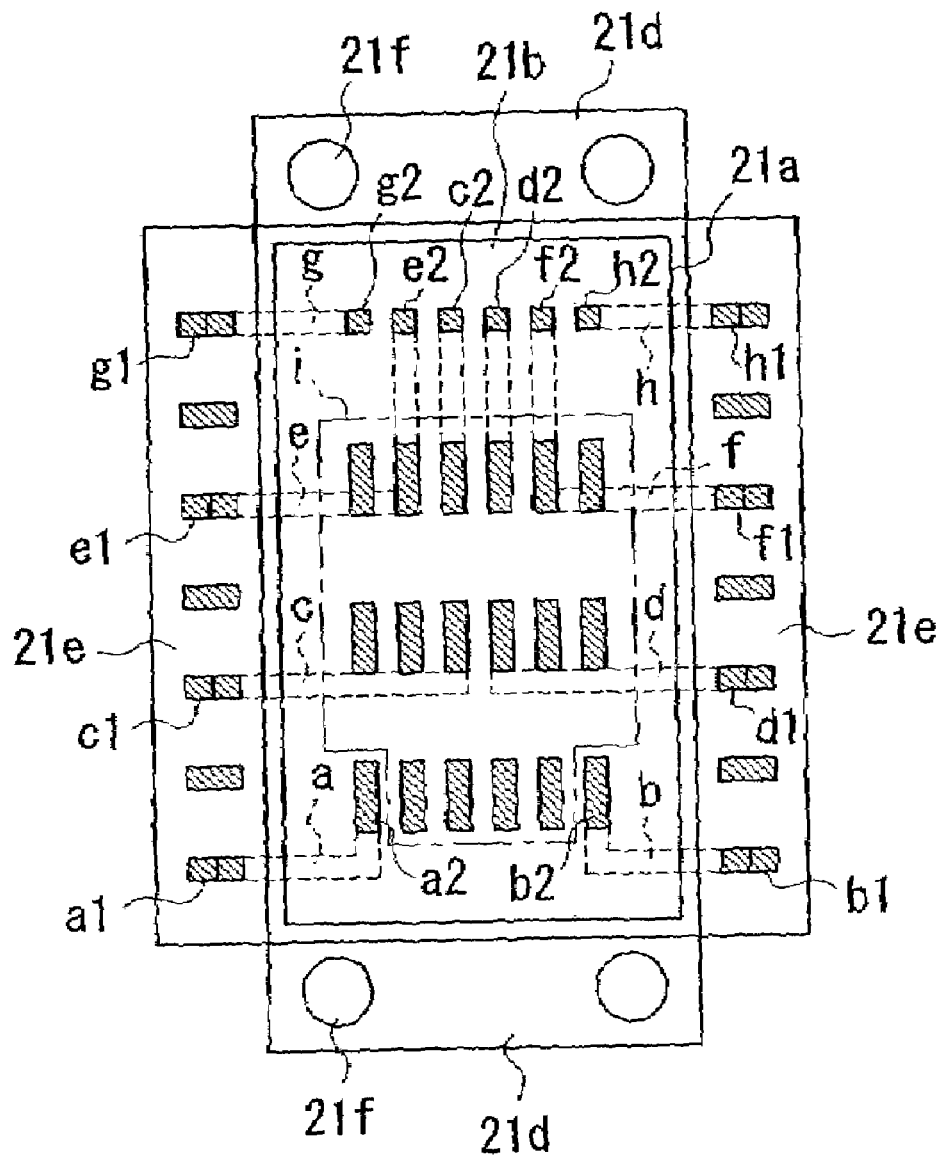
FIG. 12 is an upper view showing electrode patterns and conduction patterns formed in the package shown in FIG. 10.
Figure 13A:
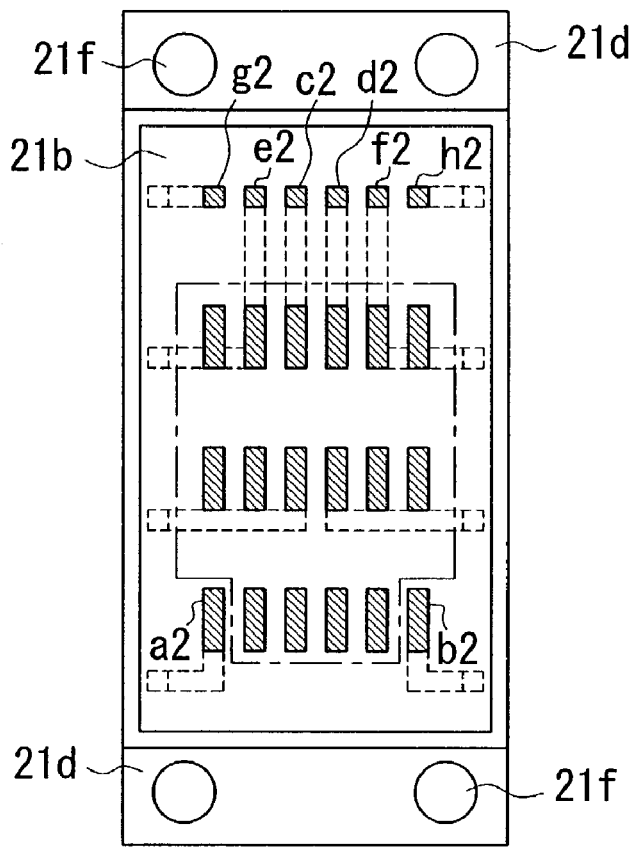
FIG. 13A is an upper view showing electrode patterns formed in the package.
Figure 13B:
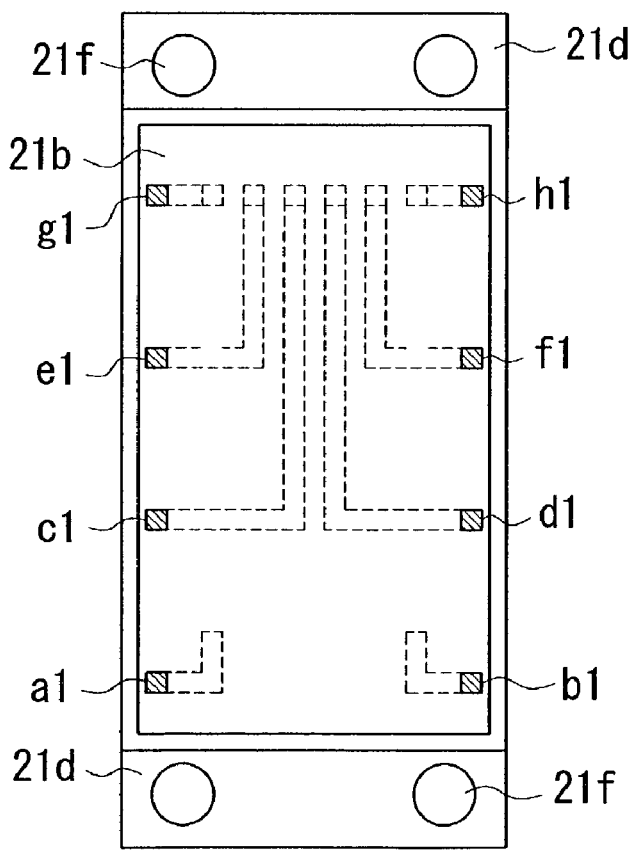
FIG. 13B is a lower view showing conduction patterns formed in the package.

Next, descriptions will be given with respect to a package that is constituted by integrally forming together a frame member and a base member in accordance with a second embodiment, as well as an optical semiconductor module using this package, with reference to accompanying drawings. FIG. 10 is an exploded perspective view showing essential parts of a package in accordance with the second embodiment; FIG. 11 is a perspective view roughly showing an assembled state of the package shown in FIG. 10. In addition, FIG. 12 shows electrode patterns and conduction patterns formed in the package shown in FIG. 10. FIGS. 13A and 13B show a modified example of electrode patterns and conduction patterns formed in the package, wherein FIG. 13A is an upper view showing electrode patterns formed in the package, and FIG. 13B is a lower view showing conduction patterns formed in the package.

Figure 14:
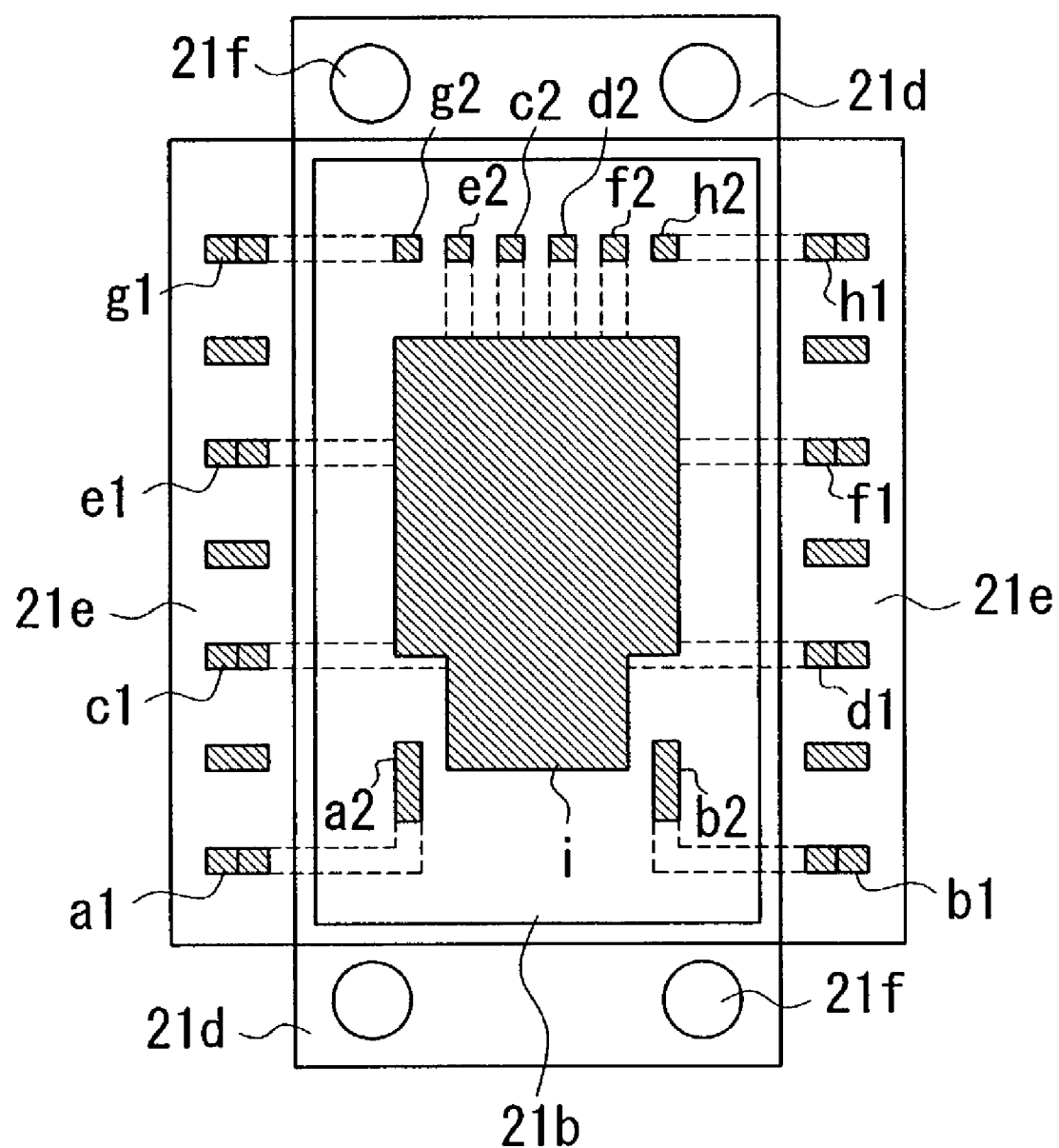
FIG. 14 is an upper view showing a modified example of the package to be equipped with a thermoelectric module having a lower substrate.
Figure 15A:
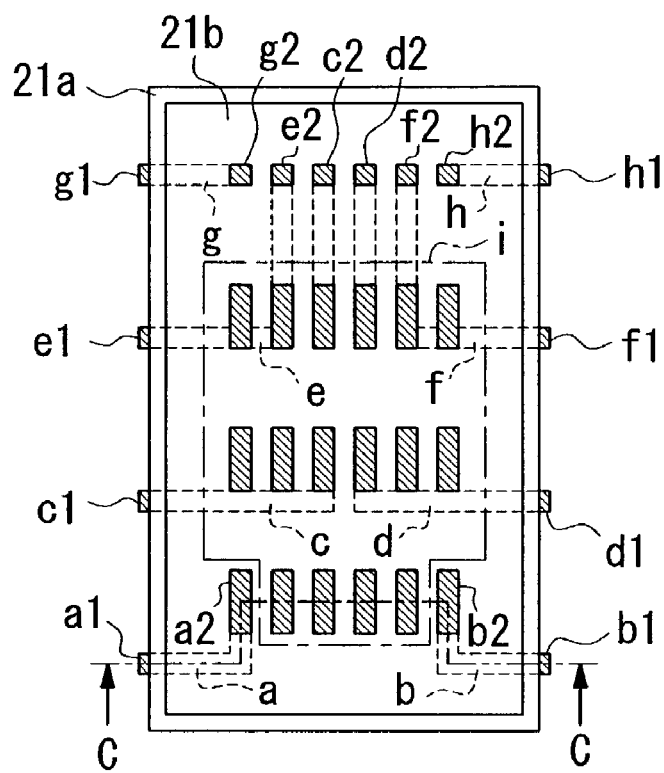
FIG. 15A is an upper view showing electrode patterns formed in a package of a further modified example.
Figure 15B:
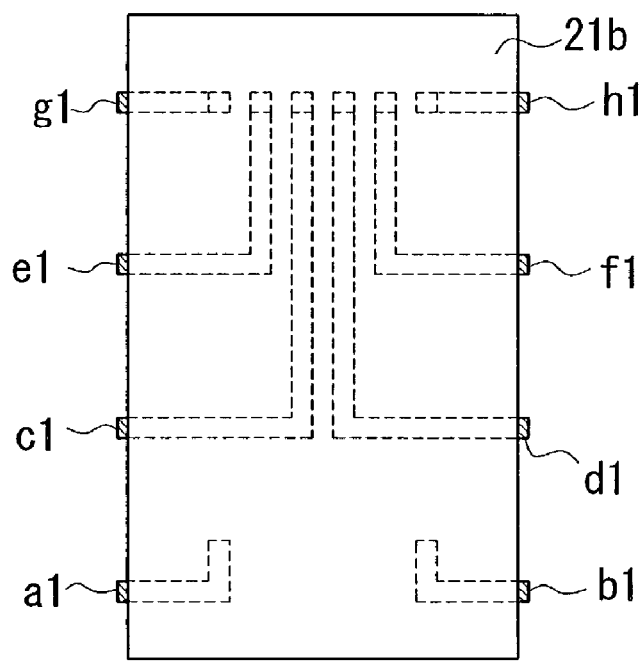
FIG. 15B is a lower view showing conduction patterns formed in the package.
Figure 15C:
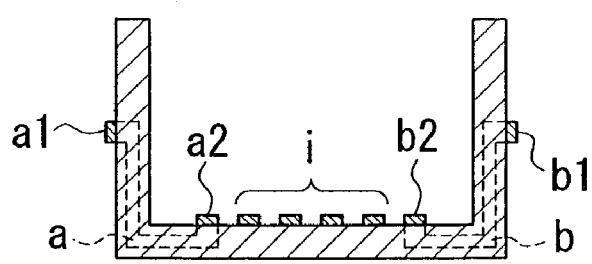
FIG. 15C is a cross sectional view taken along line C—C in FIG. 15A.
Figure 16A:
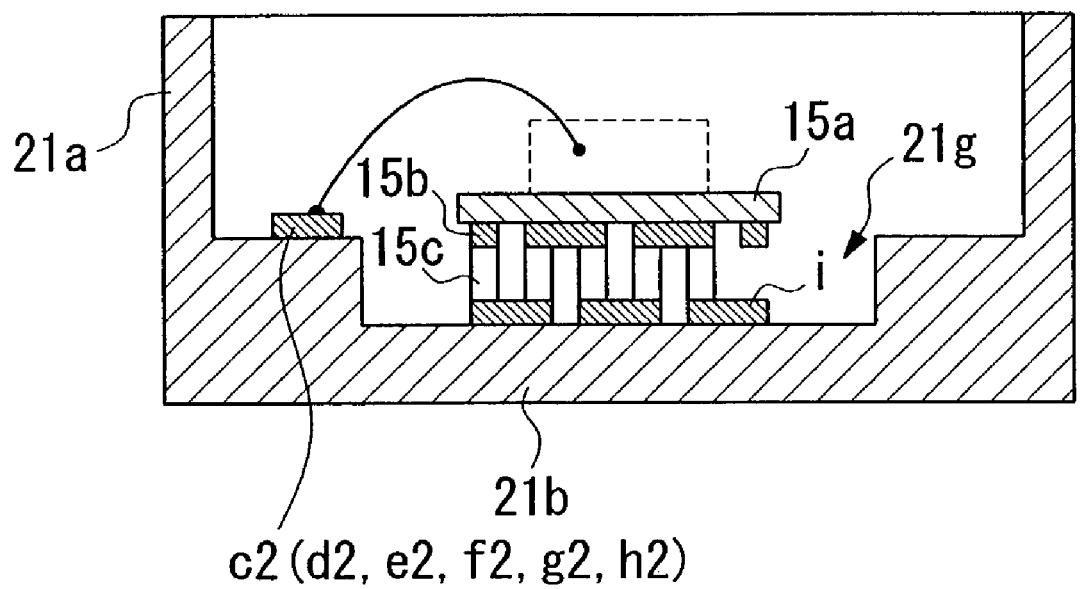
FIG. 16A is a cross sectional view showing a semiconductor element mounted on a thermoelectric module not having a lower substrate joining internal electrodes formed in a package by wire boding.
Figure 16B:
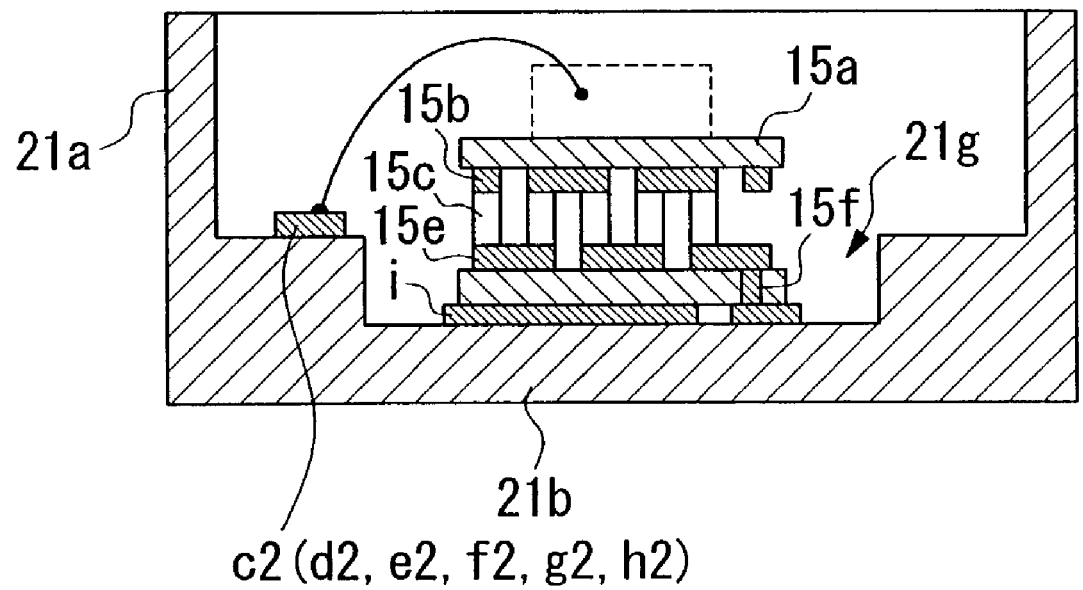
FIG. 16B is a cross sectional view showing a semiconductor element mounted on a thermoelectric module having a lower substrate joining internal electrodes formed in a package by wire bonding.

FIG. 14 is an upper view showing a modified example of the package with which a thermoelectric module having a lower substrate is joined. FIGS. 15A and 15B show another modified example of the package, wherein FIG. 15A is an upper view showing electrode patterns formed in the package, FIG. 15B is a lower view showing conduction patterns formed in the package, and FIG. 15C is a cross sectional view taken along line C—C in FIG. 15A. FIG. 16 diagrammatically shows an improvement in which a semiconductor element arranged on a thermoelectric module joins internal electrodes formed in a package by wire bonding, wherein FIG. 16A is a cross sectional view showing that a thermoelectric module not having a lower substrate is joined to the package, and FIG. 16B is a cross sectional view showing that a thermoelectric module having a lower substrate is joined to the package.

(1) Optical Semiconductor Module Package

As shown in FIGS. 10 and 11, an optical semiconductor module package 20 of the second embodiment is mainly constituted by a body 21 and a cap member 22 acting as a cover of the body 21. Herein, the package body 21 is constituted by integrally forming together a frame 21a having roughly a box-like shape having side walls and a base 21b constructing a planar bottom wall. In addition, a circular opening 21c is formed at substantially the center portion of one side wall of the frame 21a. Furthermore, fixing portions 21d are extended outwardly from both ends of the base 21b in the longitudinal direction, while terminal portions 21e are extended outwardly from the other ends of the base 21b in the width direction. Holes 21f are formed at prescribed positions of the fixing portions 21d respectively.

The package 21 is produced by the integral formation of a multilayer substrate that is composed of a prescribed ceramic material having a relatively small coefficient of thermal expansion such as alumina ($Al_2O_3$), aluminum nitride (AlN), and silicon carbide (SiC). Similar to the package 21, the cap member 22 is composed of a prescribed ceramic material having a relatively small coefficient of thermal expansion such as alumina ($Al_2O_3$), aluminum nitride (AlN), and silicon carbide (SiC), or it is made by a thin metal plate composed of FeNiCo alloy (e.g., Kovar) and is made planar, for example.

Similar to the aforementioned first embodiment, prescribed conduction patterns a–h (encompassed by dotted lines in FIG. 12; see FIG. 3B) are embedded in the base 21b. In addition, prescribed external electrode patterns a1–h1, which conduct to the aforementioned conduction patterns a–h respectively, are formed on the surfaces of the terminal portions 21e extending outwardly from the base 21b. Furthermore, internal electrode patterns a2–h2, which conduct to the conduction patterns a–h respectively, and a thermoelectric module metallizing portion i (which matches an electrode pattern formed in a thermoelectric module) are formed on the surface of the base 21b in the frame 21a.

Each of the aforementioned conduction patterns a–h, external electrode patterns a1–h1, internal electrode patterns a2–h2, and thermoelectric module metallizing portion i is composed of a prescribed metal material such as Cu, W, Mo, Mn, and Ag, or it is composed of a prescribed alloy composed of these metal materials, for example. In addition, Ni plating is effected thereon, and Au plating is further effected on Ni plating as necessary. A lead member 23 is brazed onto the surface of the external electrode patterns a1–h1 by using a prescribed material such as Ag alloy, Cu alloy, and Au alloy. Alternatively, it is soldered to the surface of the external electrode patterns a1–h1 by using a prescribed alloy such AuSn alloy, AuSi alloy, and AuGe alloy.

As shown in FIG. 10, the lead member 23 is constituted by comb teeth 23a and interconnecting portions 23b, wherein it is made by using a comb-shaped thin plate, which is composed of a prescribed alloy such as FeNiCo alloy (i.e., Kovar) and Cu alloy, or which is composed of a prescribed multimetal material such as Cu. Herein, plating is effected on the comb-shaped lead member 23 as necessary. Specifically, the comb teeth 23a join the external electrode patterns a1–h1 and other electrode elements formed therebetween; and then, the interconnecting portions 23b are cut out by cutting the base portions of the comb teeth 23a (see FIG. 11), so that the comb teeth 23b remain as leads connected with the terminal portions 21e of the package 21.

Figure 21:
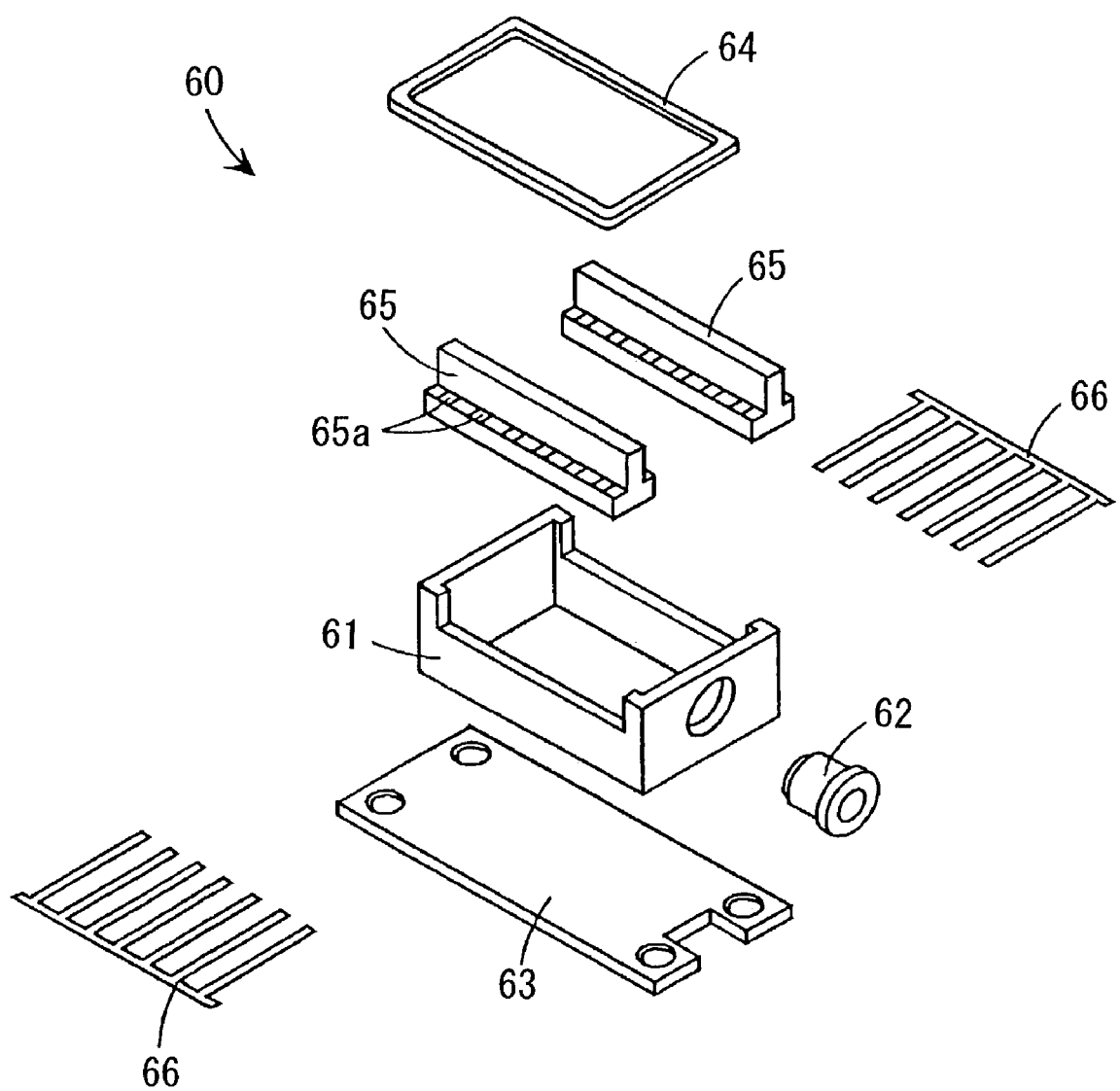
FIG. 21 is an exploded view showing essential parts of an optical semiconductor module package, which are to be assembled together.
Figure 22A:
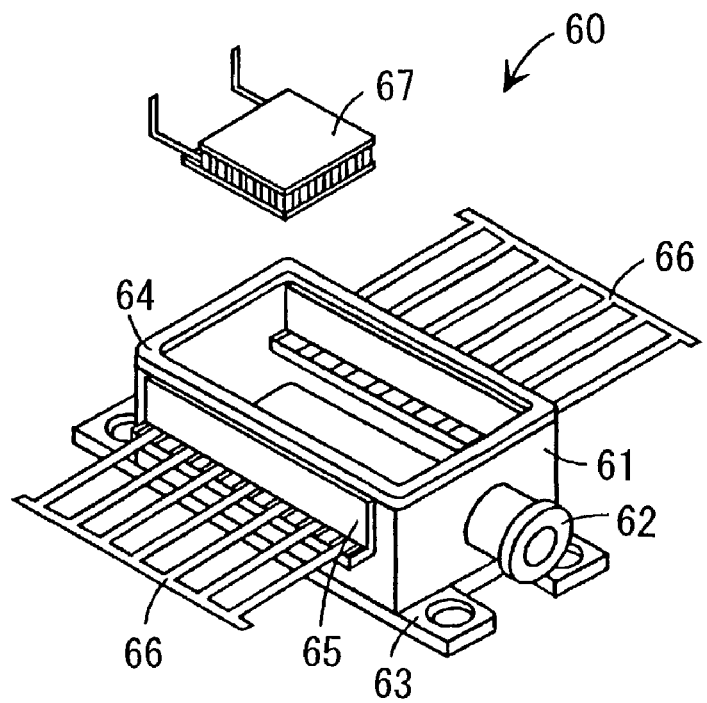
FIG. 22A is a perspective view showing the optical semiconductor module package into which a thermoelectric cooler (TEC) is to be arranged.
Figure 22B:
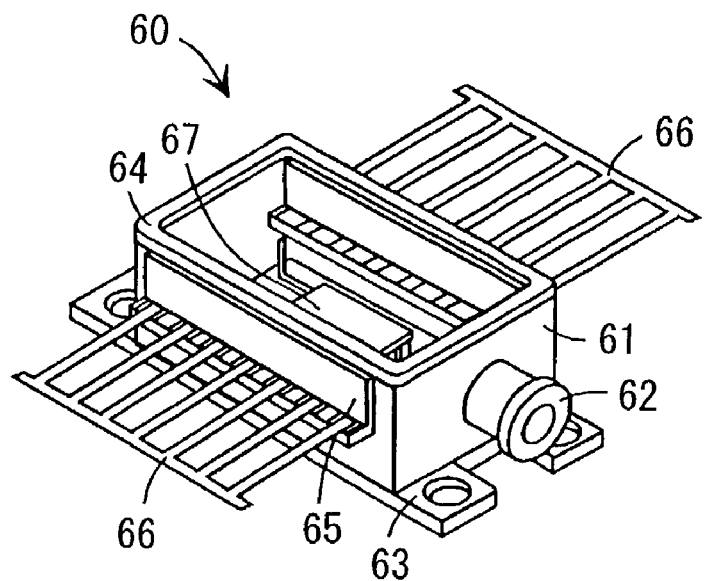
FIG. 22B is a perspective view showing the optical semiconductor module package completely storing the thermoelectric cooler therein.

Similar to the first embodiment, a thermoelectric module (not shown) is mounted to join the thermoelectric module metallizing portion i formed on the base 21b of the package 21. A semiconductor laser (not shown) is further arranged on the thermoelectric module; and then, the cap member 22 is arranged on the frame 21a, wherein they are subjected to brazing using a prescribed material such as Ag alloy, Cu alloy, and Au alloy, or they are subjected to soldering using a prescribed alloy such as AuSn alloy, AuSi alloy, and AuGe alloy, or they are joined together in an airtight manner by seam welding, so that an optical semiconductor module is produced. In order to improve joining ability when joining the cap member 22 on the frame 21a by soldering, brazing, or welding, it is preferable to join a seal ring 64 (see FIG. 21) on the frame 21a in advance before joining together with the cap member 22. Thus, it is possible to improve a joining ability between the frame 21a and the cap member 22 compared with the aforementioned example in which the cap member 22 is arranged to directly join the frame 21a. In the case of seam welding, in particular, it is possible to further improve a joining ability.

(2) Manufacturing Process

Next, descriptions will be given with respect to a concrete example of the package 20 of the second embodiment and a concrete example of an optical semiconductor module using the package 20 in accordance with manufacturing steps.

That is, two ceramic green sheets mainly composed of prescribed ceramic materials such as alumina ($Al_2O_3$), aluminum nitride (AlN), and silicon carbide (SiC) are prepared in advance with respect to each of side walls of the package 20, wherein ten ceramic green sheets are prepared in total with respect to five side walls. Herein, a plurality of guide holes for positioning are punched on each pair of ceramic green sheets by using substantially the same metal mold or punching machine. Then, prescribed conduction patterns a–h (encompassed by dotted lines in FIG. 12) are formed on one ceramic green sheet constructing the base 21b by screen printing.

In addition, through hole conductors, which conduct to the conduction patterns a–h, external electrode patterns a1–h1 and other electrode elements formed therebetween, internal electrodes a2–h2, and a thermoelectric module metallizing portion i are formed on the other ceramic green sheet constructing the base 21b as shown in FIG. 12. By using the aforementioned guide holes, two ceramic green sheets are combined together with a prescribed positioning established therebetween, thus constructing the base 21b.

Four pairs of ceramic green sheets, which are combined together to construct four side walls of the frame 21a, are arranged and laminated together to form a box-like shape, wherein the aforementioned circular opening 21c is formed with respect to one pair of ceramic green sheets. Specifically, they are integrated together by thermocompression bonding under prescribed conditions where temperature ranges from 50° C. to 150° C., and pressure ranges from 50 kg/cm$^2$ to 250 kg/cm$^2$, for example, wherein they are subjected to sintering to produce the package 21 constituted by a multilayer substrate. Herein, Ni plating is effected on metallized surfaces that are exposed on the surface as necessary. Instead of forming the circular opening 21c with respect to one pair of ceramic green sheets, it is possible to arrange a window holder used in the first embodiment. For example, the window holder is made of a ceramic material (or a ceramic green substance), which is arranged to join one side wall of the package 21 and is then subjected to sintering. Alternatively, the window holder can be made of a metal material, which is subjected to sintering and is then arranged to join one side wall of the package 21.

FeNiCo alloy (e.g., Kovar) having a relatively small coefficient of thermal expansion is subjected to press punching to produce the cap member 22 having a planar plate like shape. In addition, a thin plate that is composed of FeNiCo alloy (e.g., Kovar) or Cu alloy or that is composed of a metal material such as Cu is subjected to press working, thus producing the lead member 23 having a comb-like shape consisting of the comb teeth 23a and the interconnecting portions 23b. The package 21 is then installed in a prescribed instrument (not shown), so that the comb teeth (or leads) 23a of the lead member 23 are arranged on the external electrode patterns a1–h1 and other electrode elements formed therebetween by way of a prescribed brazing material such as Ag alloy.

The aforementioned instrument is subjected to heating process, so that the leads 23a are respectively arranged to join the external electrode patterns a1–h1 and other electrode elements formed therebetween. Thus, the package 20 is produced completely, wherein Ni plating or Pd plating is effected on the leads 23a, and the internal electrodes a2–h2 and thermoelectric module metallizing portion i formed on the surface of the base 21b as necessary. Furthermore, Au plating is further effected on the Ni plating or Pd plating.

Similar to the first embodiment, a thermoelectric cooler (TEC) is produced by joining a thermoelectric module (not shown) having a single substrate at one side thereof with the thermoelectric module metallizing portion i formed on the surface of the base 21b. Then, a semiconductor laser (not shown) is mounted on the thermoelectric module, and an optical system (not shown) is arranged on the optical axis of the semiconductor laser. Thereafter, the cap member 22 is arranged on the frame 21a, wherein they are brazed to each other by using a prescribed material such as Ag alloy, Cu alloy, and Au alloy, or they are soldered to each other by using a prescribed alloy such as AuSn alloy, AuSi alloy, and AuGe alloy, or they are joined together in an airtight manner by seam welding.

Then, the interconnecting portions 23b are cut out by cutting the base portions of the leads 23a of the lead member 23, so that an optical semiconductor module shown in FIG. 11 is produced. Herein, a heatsink (not shown) is arranged below the base 21b of the package 21 via silicone grease and is attached to the fixing portions 21d of the base 21b by inserting screws into the holes 21f; thus, it is possible to produce an optical semiconductor module having superior heat radiation characteristics. When the cap member 22 joins the frame 21a by seam welding, it is preferable to combine a ring (composed of Kovar, for example) onto the frame 21a by brazing.

As described above, the second embodiment is realized by the package 21 that is constituted by integrally forming together the frame 21a and the base 21b, wherein it is possible to reduce the number of parts compared with the package 10 of the first embodiment. Therefore, it is possible to simplify assembling of the thermoelectric module package, which can be manufactured with a relatively small manufacturing cost. Incidentally, both the frame 21a and the base 21b are not necessarily made of the same ceramic material. That is, the base 21b can be produced using a ceramic material of a relatively high thermal conductivity such as AlN, and the frame 21a can be produced using a ceramic material of a relatively low thermal conductivity such as $Al_2O_3$, for example.

(3) Modifications

Similar to the first embodiment, it is possible to provide various modifications with respect to the second embodiment. For example, the package 21 is modified as shown in FIGS. 13A and 13B in such a way that no terminal portion 21e is formed for the base 21b in the width direction, while the external electrode patterns a1–h1 are formed on the backside of the base 21b. In this case, the internal electrode patterns a2–h2 and the thermoelectric module metallizing portion i are formed on the surface of the base 21b. This modification eliminates the necessity of arranging the terminal portions 21e extended outwardly from the base 21b in the width direction; therefore, it is possible to reduce the overall size of the package 21. In addition, this modification also eliminates the necessity of connecting the leads 23a with the package 21; therefore, it is possible to simplify the manufacture of the package 21. Of course, it is possible to arrange the leads 23a connected with the package 21.

When using the aforementioned thermoelectric module (see FIG. 7B) in which the electrode patterns 15b are formed on the upper substrate 15a and the electrode patterns 15d are also formed on the lower substrate 15e, it is possible to modify the package 21 as shown in FIG. 14 such that the thermoelectric module metallizing portion i, which substantially matches the shape of the lower surface of the thermoelectric module, is formed on the base 21b, and the internal electrodes a2 and b2 (or power supply electrode patterns) are formed at prescribed positions, which substantially match through holes (in which conduction layers are formed) of the lower substrate of the thermoelectric module, on the base 21b.

In addition, the package 21 can be modified not to form terminal portions 21e extended outwardly from the base 21b in the width direction as shown in FIGS. 15A to 15C so that external electrodes a1–h1 are respectively formed on side surfaces of the frame 21a. Herein, electrical connections can be established without using leads, or they can be established by using leads as necessary. In this case, prescribed conduction patterns a–h (encompassed in dotted lines in FIG. 15B) are formed on one ceramic green sheet constructing the base 21b by screen printing; conduction patterns a, c, e, and g are formed on one ceramic green sheet constructing one side wall of the frame 21a; and conduction patterns b, d, f, and h are formed on the other ceramic green sheet constructing the other side wall of the frame 21a.

In addition, through hole conductors, which conduct to the conduction patterns a–h, internal electrodes a2–h2, and a thermoelectric module metallizing portion i are formed on the other ceramic green sheet constructing the base 21b. Furthermore, external electrodes a1, c1, e1, and g1 are formed on one ceramic green sheet constructing one side wall of the frame 21a, and external electrodes b1, d1, f1, and h1 are formed on the other ceramic green sheet constructing the other side wall of the frame 21a.

Furthermore, the package 21 can be modified as shown in FIGS. 16A and 16B such that a hollow portion 21g is formed substantially at the center portion of the base 21b, wherein the thermoelectric module 15 is arranged in the hollow portion 21g, and internal electrodes c2–h2 are formed on the surface of the base 21b. This reduces height differences between the upper portion of the thermoelectric module 15 and the internal electrodes c2–h2; therefore, it is possible to perform wire bonding on a semiconductor element mounted on the upper portion of the thermoelectric module 15 with ease.

3. Manufacturing Process of Thermoelectric Module

Next, various examples will be described with respect to manufacturing processes of thermoelectric modules in conjunction with the attached drawings, wherein FIGS. 17A to 17F and FIGS. 18A to 18C diagrammatically show a series of steps in a manufacturing process of a thermoelectric module in accordance with Example 1; FIGS. 19A to 19F show a series of steps in a manufacturing process of a thermoelectric module in accordance with Example 2; and FIGS. 20A to 20D show a series of steps in a manufacturing process of a thermoelectric module in accordance with Example 3. Details will be described below.

(1) EXAMPLE 1

Figure 17A:
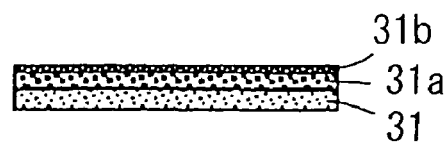
FIGS. 17A to 17F diagrammatically show a series of steps in a manufacturing process of a thermoelectric module in accordance with Example 1.
Figure 17B:
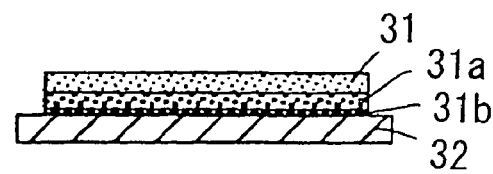

First, as shown in FIG. 17A, Ni plating is effected on one surface of a Cu thin plate 31 whose thickness is 100 µm, thus forming a layer 31a whose thickness is 4 µm. Then, Au plating is effected to form a layer 31b whose thickness is 0.05 µm. As shown in FIG. 17B, a resin film 32 composed of a heat-resistant resin (e.g., a polyimide resin) is bonded onto the Au plated layer 31b.

Figure 17C:
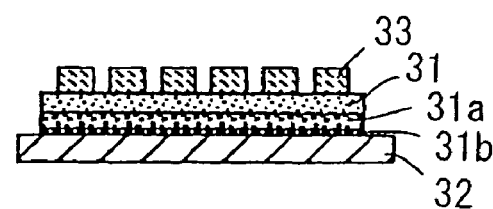
Figure 17D:
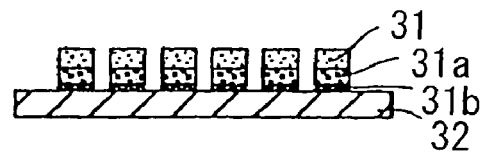
Figure 17E:
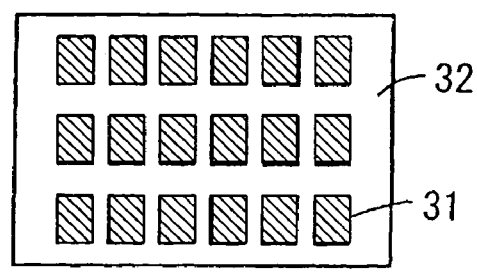
Figure 17F:
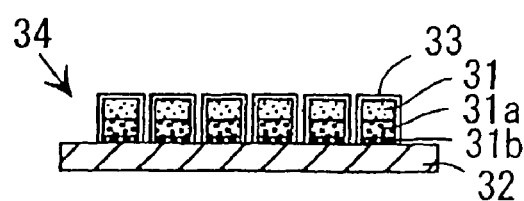

A resist agent is applied to the surface of the Cu thin plate 31, which is then subjected to exposure and development, so that a resist pattern 33 is formed on the Cu thin plate 31 as shown in FIG. 17C. Then, etching is performed to remove unnecessary portions of the Cu thin plate 31 and the plated layers 31a and 31b, and then the resist is removed as well as shown in FIG. 17D. Thus, it is possible to form a prescribed pattern arranging Cu thin elements 31 (see FIG. 17E), which correspond to electrode patterns for joining Peltier elements. Thereafter, electroless plating is effected on the overall surface of the Cu thin elements 31 arranged in the prescribed pattern, thus forming plated layers 33 composed of Ni (4 µm thickness) and Au (0.05 µm thickness). Thus, it is possible to produce a first substrate 34 shown in FIG. 17F.

Figure 18A:
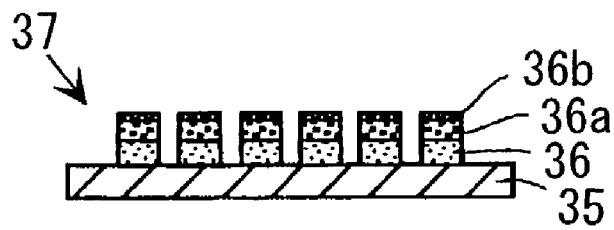
FIGS. 18A to 18C diagrammatically show a series of steps remaining in the manufacturing process of the thermoelectric module in accordance with example 1.

There is provided a ceramic substrate 35 on which Cu thin elements 36 are arranged in a prescribed pattern, on which Ni plating is effected to form layers 36a whose thickness is 4 µm, and Au plating is further effected to form layers 36b whose thickness is 0.05 µm, thus producing a second substrate 37 shown in FIG. 18A. The ceramic substrate 35 is composed of a prescribed ceramic material such as alumina ($Al_2O_3$), aluminum nitride (AlN), and silicon carbide (SiC). Then, Peltier elements 38, both ends of which are subjected to Ni plating, are arranged on the Au plated layers 36b of the second substrate 37 via solders 39.

Figure 18B:
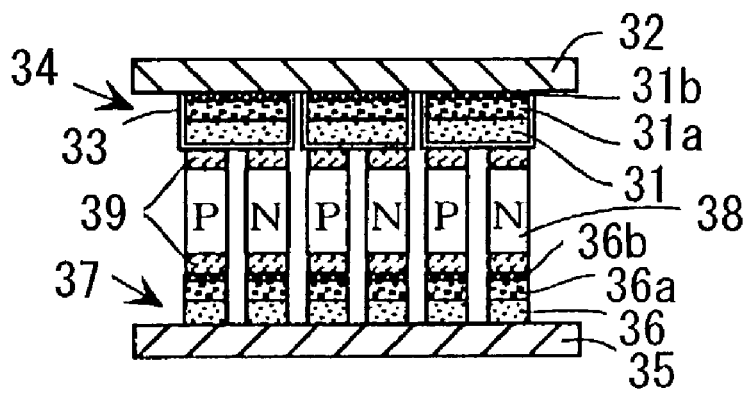
Figure 18C:
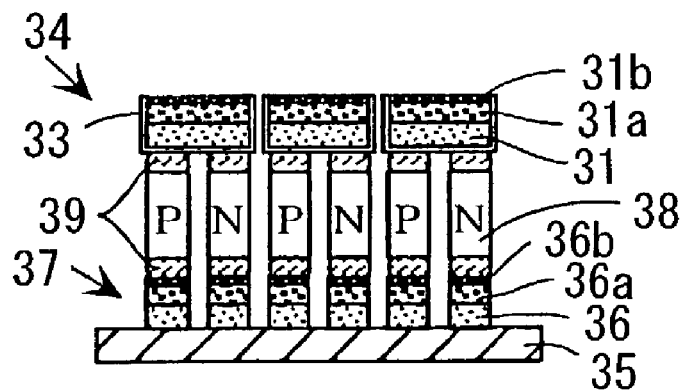

In addition, the aforementioned first substrate 34 having the plated layers 33 are arranged on the Peltier elements 38 via solders 39. Thus, it is possible to produce a laminated structure in which the Peltier elements 38 are sandwiched between the first substrate 34 and the second substrate 37 via the solders 39 as shown in FIG. 18B. Such a laminated structure is then arranged on a hot plate or in a reflow furnace (not shown) to melt the solders 39, so that both ends of the Peltier elements 38 join together with the Cu thin elements 31 and the Cu thin elements 35, which are arranged in prescribed patterns. Thereafter, the resin film 32 is removed to produce a thermoelectric module of Example 1 shown in FIG. 18C in which the Peltier elements 38 are arranged in a prescribed order for alternately changing polarities thereof between p-type and n-type.

(2) EXAMPLE 2

Figure 19A:
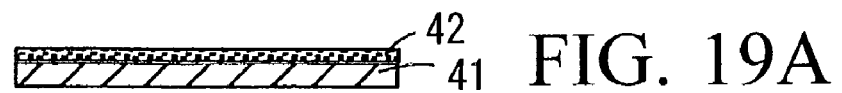
FIGS. 19A to 19F diagrammatically show a series of steps in a manufacturing process of a thermoelectric module in accordance with Example 2.
Figure 19B:
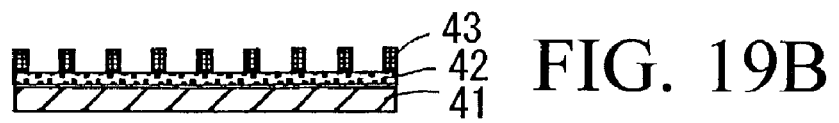
Figure 19C:
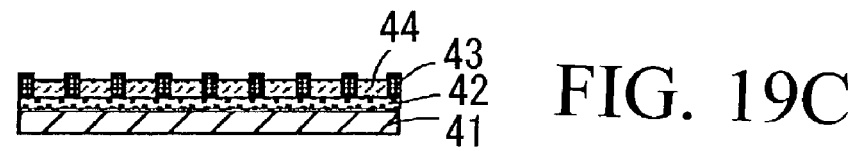
Figure 19D:
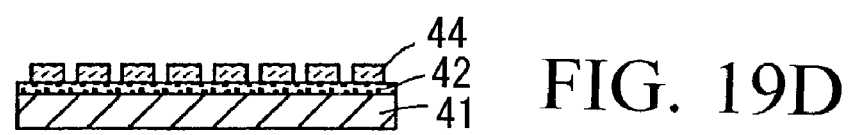
Figure 19E:
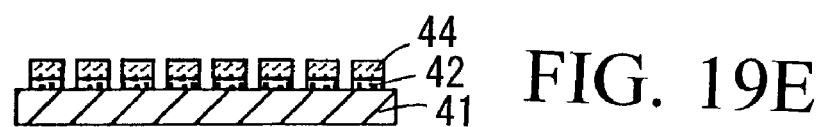
Figure 19F:
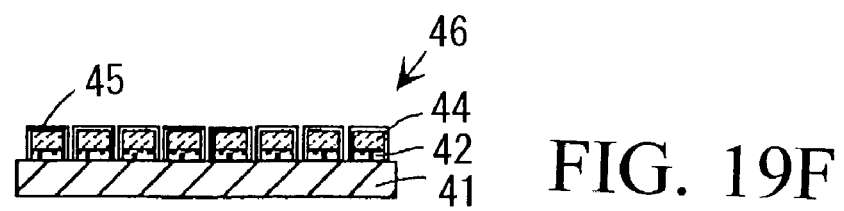

First, as shown in FIG. 19A, an Ni layer 42 whose thickness is 4 µm is formed on one surface of a resin sheet 41 composed of a heat-resistant resin (e.g., a polyimide resin). Herein, it is possible to form a metal layer whose thickness is 0.05 µm before forming the Ni layer of 4 µm on the resin sheet 41. Resist agent is applied to the Ni layer 42 formed on the resin sheet 41, which is then subjected to exposure and development, so that a resist pattern 43 is formed as shown in FIG. 19B. Then, Cu plating is effected to form Cu layers 44 in the resist pattern 43 as shown in FIG. 19C. Thereafter, the resist pattern 43 is removed, and then etching is performed to remove unnecessary portions of the Ni layer 42 as shown in FIG. 19D.

Thus, it is possible to arrange Cu thin elements 44 in a prescribed pattern on the resin sheet 41 via remaining portions of the Ni layer 42, wherein the Cu thin elements 44 are arranged in prescribed electrode patterns joining Peltier elements. In addition, electroless plating using Ni (4 µm thickness) and Au (0.05 µm thickness) is performed to form plated layers 45, thus completely producing a first substrate 46 shown in FIG. 19F. Similar to the aforementioned Example 1, a second substrate is produced with respect to Example 2. Then, Peltier elements are soldered between the Cu thin elements 44 of the first substrate 46 and Cu thin elements of the second substrate (not shown). Thereafter, the resin sheet 41 is removed to produce a thermoelectric module of Example 2 in which the Peltier elements are arranged in a prescribed order for alternately changing polarities thereof between p-type and n-type.

(3) EXAMPLE 3

Figure 20A:
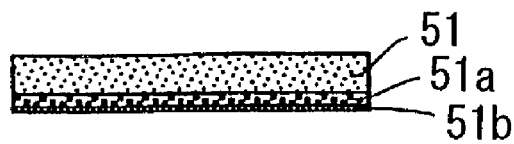
FIGS. 20A to 20D diagrammatically show a series of steps in a manufacturing process of a thermoelectric module in accordance with Example 3.
Figure 20B:
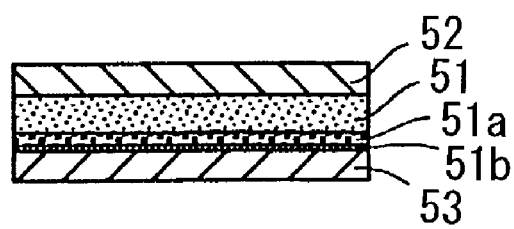
Figure 20C:
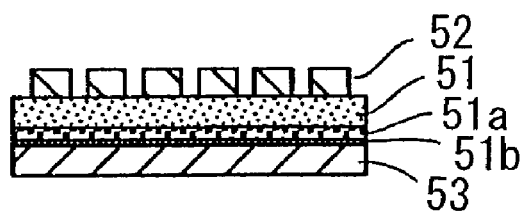

First, as shown in FIG. 20A, Ni plating is effected to form a layer 51a whose thickness is 4 µm on one surface of a Cu thin plate 51 whose thickness is 100 µm; and then, Au plating is effected for form a layer 51b whose thickness is 0.05 µm. Then, a first dry film 52 is arranged on the other surface of the Cu thin plate 51, while a second dry film 53 is arranged in contact with the Au plated layer 51b as shown in FIG. 20B. Thereafter, the laminated structure of FIG. 20B is subjected to compressive bonding by using a vacuum laminator, for example. The first dry film 52 is subjected to exposure and development, and then etching is performed to form a resist pattern 52 on the Cu thin plate 51 as shown in FIG. 20C.

Figure 20D:
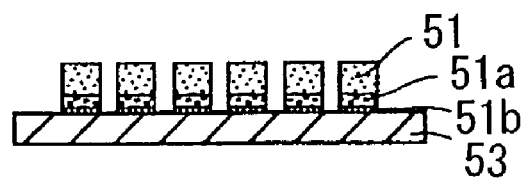

Then, etching is performed using the resist pattern 52 as a mask, so that as shown in FIG. 20D, unnecessary portions of the Cu thin plate 51 are removed, and then the resist pattern 52 is removed as well. Thus, it is possible to arrange remained portions of the Cu thin plate 51 in prescribed patterns, which correspond to electrode patterns joining Peltier elements. Similarly to the aforementioned Example 1, electroless plating using Ni (4 µm thickness) and Au (0.05 µm thickness) is effected on an arrangement of the remaining portions of the Cu thin plate 51, thus producing a first substrate.

Then, similarly to the aforementioned Example 1, a second substrate is produced as well. Thereafter, Peltier elements are soldered between Cu thin elements of the first substrate and Cu thin elements of the second substrate; and then, the second dry film 53 is removed to produce a thermoelectric module of example 3 in which the Peltier elements are arranged in a prescribed order for alternately changing polarities thereof between p-type and n-type.

As described heretofore, this invention has a variety of effects and technical features, which will be described below.

(1) Due to formation of external electrode patterns a1–h1 and internal electrode patterns a2–h2 on the surface of a base member, it is unnecessary to arrange ceramic field through members, so that a cap member can be directly welded to a frame member. This also eliminates the necessity of arranging a seal ring, which is conventionally required. As a result, it is possible to reduce the total number of parts required for manufacturing a thermoelectric module package, which can be therefore manufactured with ease and at a relatively low cost.

(2) A package can be constituted by integrally combining together a frame and a base, so that it is possible to further reduce the number of parts required for manufacturing the package, which can be therefore manufactured with ease and at a relatively low cost.

(3) The aforementioned package may be applied to optical communications in which a semiconductor laser and a thermoelectric module for controlling temperature of the semiconductor laser are contained. Of course, this invention is not necessarily limited such an application using a semiconductor laser. That is, this invention can be effectively used for other purposes in which a thermoelectric module is used to control temperature of a semiconductor element of a high output power in a package, for example.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A thermoelectric module package for storing a thermoelectric module performing temperature control on a semiconductor element, comprising:
    a frame member; and
    a base member combined together with the frame member,
    wherein a plurality of internal electrodes for establishing electric connections with the semiconductor element and/or the thermoelectric module, and a plurality of external electrodes for establishing electric connections with an external circuit are formed on the base member,
    wherein the external electrodes are formed only on the base member, and the electric connections are realized only on the base member, and wherein both the electrodes for inputting and outputting currents with the external circuit are arranged on the base member.

2. A thermoelectric module package for storing a thermoelectric module performing temperature control on a semiconductor element, comprising:
    a frame member; and
    a base member combined together with the frame member,
    wherein a plurality of internal electrodes for establishing electric connections with the semiconductor element and/or the thermoelectric module, and
    a plurality of external electrodes for establishing electric connections with an external circuit are formed on the base member and the base member is made of a multilayer substrate in which wiring is embedded to interconnect together the internal electrodes and the external electrodes.

3. A thermoelectric module package according to claim 1, wherein the base member acts as a lower substrate of the thermoelectric module.

4. A thermoelectric module package according to claim 2, wherein the base member acts as a lower substrate of the thermoelectric module.

5. A thermoelectric module package according to any one of claims 1 to 4, wherein leads are further arranged to interconnect together the external electrodes and the external circuit.

6. A thermoelectric module package for storing a thermoelectric module performing temperature control on a semiconductor element, comprising:
    a frame member; and
    a base member combined together with the frame member,
    wherein a plurality of internal electrodes for establishing electric connections with the semiconductor element and/or the thermoelectric module, and a plurality of external electrodes for establishing electric connections with an external circuit are formed on the base member and the plurality of internal electrodes are formed on a surface of the base member, and the plurality of external electrodes are formed on a backside of the base member, and wherein a plurality of conductors for interconnecting together the internal electrodes and the external electrodes are embedded in the base member.

7. A thermoelectric module package for storing a thermoelectric module performing temperature control on a semiconductor element, comprising:
    a package body integrally constituted by a frame and a base,
    wherein the package body is equipped with a plurality of internal electrodes for establishing electric connections with the semiconductor element and the thermoelectric module, a plurality of external electrodes for establishing electric connections with an external circuit, and wiring interconnecting together the internal electrodes and the external electrodes, and
    the external electrodes are formed only on the base member, and the electric connections are realized only on the base member, wherein both the electrodes for inputting and outputting currents with the external circuit are arranged on the base member.

8. A thermoelectric module package for storing a thermoelectric module performing temperature control on a semiconductor element, comprising:
    a package body integrally constituted by a frame and a base,
    the package body is equipped with a plurality of internal electrodes for establishing electric connections with the semiconductor element and the thermoelectric module, a plurality of external electrodes for establishing electric connections with an external circuit, and wiring interconnecting together the internal electrodes and the external electrodes and the package body is constituted by a multilayer substrate in which the wiring interconnecting together the internal electrodes and the external electrodes is embedded.

9. A thermoelectric module package according to claim 7, wherein the base of the package body acts as a lower substrate of the thermoelectric module.

10. A thermoelectric module package according to claim 8, wherein the base of the package body acts as a lower substrate of the thermoelectric module.

11. A thermoelectric module package according to any one of claims 7 to 10, wherein a plurality of leads are further arranged to interconnect together the external electrodes with the external circuit.

12. A thermoelectric module package for storing a thermoelectric module performing temperature control on a semiconductor element, comprising:
    a package body integrally constituted by a frame and a base,
    wherein the package body is equipped with a plurality of internal electrodes for establishing electric connections with the semiconductor element and the thermoelectric module, a plurality of external electrodes for establishing electric connections with an external circuit, and wiring interconnecting together the internal electrodes and the external electrodes and the plurality of internal electrodes are formed on a surface of the base of the package body, and the plurality of external electrodes are formed on a backside of the base of the package body, and wherein a plurality of conductors interconnecting together the internal electrodes and the external electrodes are embedded in the base of the package body.

13. A thermoelectric module package for storing a thermoelectric module performing temperature control on a semiconductor element, comprising:

a package body integrally constituted by a frame and a base, wherein the package body is equipped with a plurality of internal electrodes for establishing electric connections with the semiconductor element and the thermoelectric module, a plurality of external electrodes for establishing electric connections with an external circuit, and wiring interconnecting together the internal electrodes and the external electrodes and the plurality of internal electrodes are formed on a surface of the base of the package body, and the plurality of external electrodes are formed on an external side area of the frame of the package body, and wherein a plurality of conductors interconnecting together the internal electrodes and the external electrodes are embedded in the base and/or the frame of the package body.

* * * * *